(12) United States Patent
Chopra et al.

(10) Patent No.: US 11,439,041 B2
(45) Date of Patent: Sep. 6, 2022

(54) AIR COOLED CAGE DESIGN

(71) Applicant: Cisco Technology, Inc., San Jose, CA (US)

(72) Inventors: Rakesh Chopra, Menlo Park, CA (US); M. Baris Dogruoz, Santa Clara, CA (US); Mark Nowell, Ottawa (CA); Mandy Hin Lam, Fremont, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 17 days.

(21) Appl. No.: 16/922,383

(22) Filed: Jul. 7, 2020

(65) Prior Publication Data

US 2021/0231890 A1 Jul. 29, 2021

Related U.S. Application Data

(63) Continuation of application No. 16/922,177, filed on Jul. 7, 2020.

(60) Provisional application No. 62/964,793, filed on Jan. 23, 2020.

(51) Int. Cl.
*H01R 13/00* (2006.01)
*H05K 7/20* (2006.01)
*H05K 7/14* (2006.01)
*G02B 6/42* (2006.01)
*H01R 13/518* (2006.01)

(52) U.S. Cl.
CPC ....... *H05K 7/20409* (2013.01); *G02B 6/4269* (2013.01); *H01R 13/518* (2013.01); *H05K 7/14* (2013.01); *H05K 7/20136* (2013.01)

(58) Field of Classification Search
CPC ...... H01R 13/518; G02B 6/4269; H05K 7/14; H05K 7/20136; H05K 7/20409
USPC ........................................................ 439/487
See application file for complete search history.

(56) References Cited

U.S. PATENT DOCUMENTS

| | | | |
|---|---|---|---|
| 6,504,719 B2 * | 1/2003 | Konstad | F28F 3/12 361/689 |
| 6,731,519 B1 | 5/2004 | Hwang | |
| 7,177,154 B2 * | 2/2007 | Lee | G06F 1/181 165/80.4 |
| 7,277,286 B2 * | 10/2007 | Lee | H05K 7/209 361/689 |
| 9,246,280 B2 * | 1/2016 | Neer | H05K 7/20145 |
| 9,583,886 B2 * | 2/2017 | Phillips | H01R 13/516 |
| 9,620,907 B1 * | 4/2017 | Henry | H01R 13/6582 |
| 9,851,519 B1 * | 12/2017 | Van Gaal | G02B 6/4269 |
| 9,910,231 B2 * | 3/2018 | Kelty | G02B 6/4269 |
| 10,104,760 B1 * | 10/2018 | Briant | G02B 6/4284 |
| 10,114,182 B2 * | 10/2018 | Zbinden | G02B 6/4268 |
| 10,153,571 B2 * | 12/2018 | Kachlic | H01R 13/6594 |
| 10,178,804 B2 * | 1/2019 | Sharf | H05K 7/20418 |

(Continued)

*Primary Examiner* — Abdullah A Riyami
*Assistant Examiner* — Vladimir Imas
(74) *Attorney, Agent, or Firm* — Edell, Shapiro & Finnan, LLC

(57) ABSTRACT

Presented herein are optical module cage designs and heat-sink configurations for improved air cooling of pluggable optical modules disposed within the optical module cages. The designs and configurations presented herein facilitate efficient air cooling of higher power pluggable optical modules by enhancing airflow through the optical module cages, increasing contact between the optical modules and the heatsinks, and/or increasing the heatsink dissipation surface area.

20 Claims, 29 Drawing Sheets

(56) References Cited

U.S. PATENT DOCUMENTS

| | | | |
|---|---|---|---|
| 10,305,217 B2 * | 5/2019 | Fernandes | H01R 13/514 |
| 10,375,859 B2 | 8/2019 | Wanha | |
| 10,476,198 B1 | 11/2019 | Pogash et al. | |
| 10,477,729 B2 | 11/2019 | Han et al. | |
| 10,488,608 B2 | 11/2019 | Wilcox et al. | |
| 10,511,118 B2 * | 12/2019 | Beltran | H05K 3/00 |
| 10,537,043 B2 * | 1/2020 | Aoki | H05K 7/20418 |
| 10,547,133 B1 * | 1/2020 | Consoli | G02B 6/4269 |
| 10,555,437 B2 * | 2/2020 | Little | H05K 7/20336 |
| 10,651,607 B1 | 5/2020 | Gawlowski | |
| 10,797,417 B2 * | 10/2020 | Scholeno | G02B 6/42 |
| 10,840,645 B2 * | 11/2020 | Briant | H05K 1/181 |
| 10,925,182 B2 * | 2/2021 | Sharf | H05K 7/20009 |
| 11,011,861 B1 * | 5/2021 | Briant | G02B 6/4292 |
| 11,054,592 B2 * | 7/2021 | Lin | H05K 7/20409 |
| 11,088,715 B2 * | 8/2021 | Sharf | H04B 1/036 |
| 2008/0019100 A1 * | 1/2008 | Yang | H05K 9/0058 361/716 |
| 2012/0099275 A1 | 4/2012 | Regnier | |
| 2012/0196477 A1 | 8/2012 | Nichols et al. | |
| 2016/0197424 A1 * | 7/2016 | L'Esperance | G02B 6/4268 439/61 |
| 2016/0211620 A1 | 7/2016 | Sharf et al. | |
| 2016/0295744 A1 | 10/2016 | Regnier | |
| 2017/0077643 A1 | 3/2017 | Zbinden et al. | |
| 2017/0285282 A1 | 10/2017 | Regnier et al. | |
| 2018/0337476 A1 | 11/2018 | Guy Ritter et al. | |
| 2019/0181582 A1 | 6/2019 | Beltran et al. | |
| 2020/0076455 A1 | 3/2020 | Sharf | |
| 2020/0077541 A1 | 3/2020 | Sharf | |
| 2020/0274295 A1 | 8/2020 | Briant | |
| 2020/0295498 A1 | 9/2020 | Lloyd et al. | |
| 2020/0367392 A1 | 11/2020 | Long et al. | |
| 2021/0022268 A1 | 1/2021 | Sharf | |
| 2021/0105915 A1 | 4/2021 | Wang et al. | |
| 2021/0226361 A1 * | 7/2021 | Mason | H01R 13/6471 |

* cited by examiner

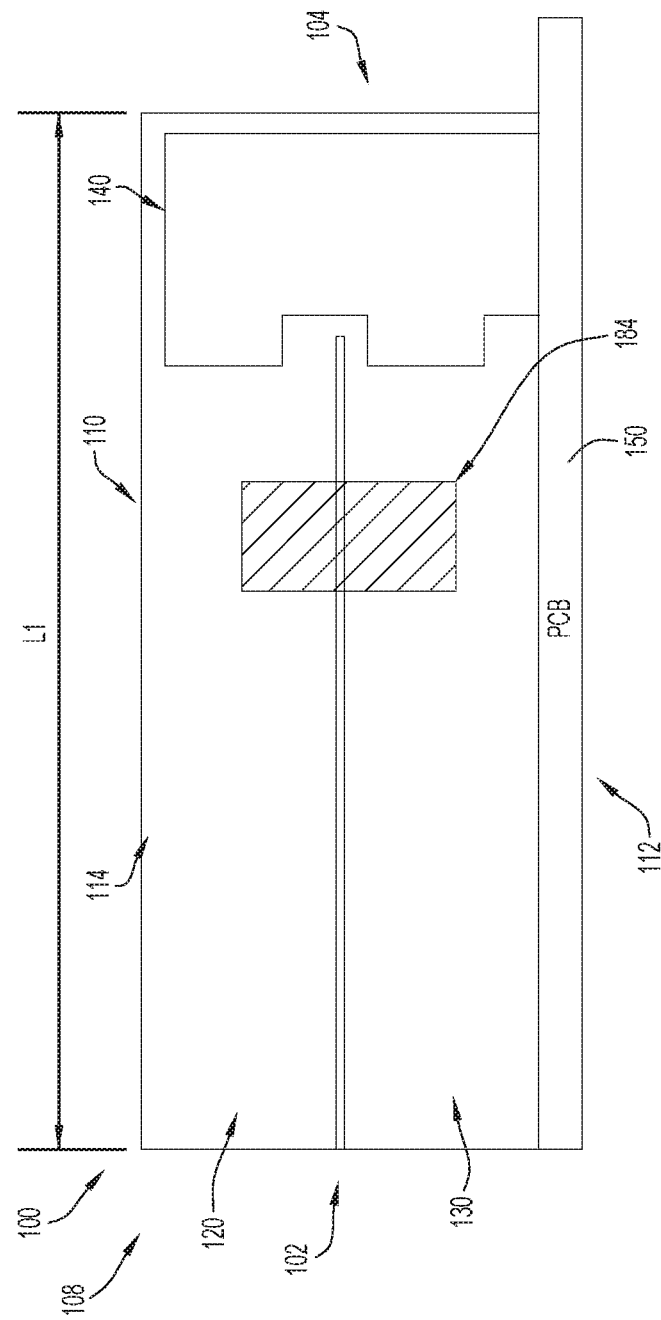

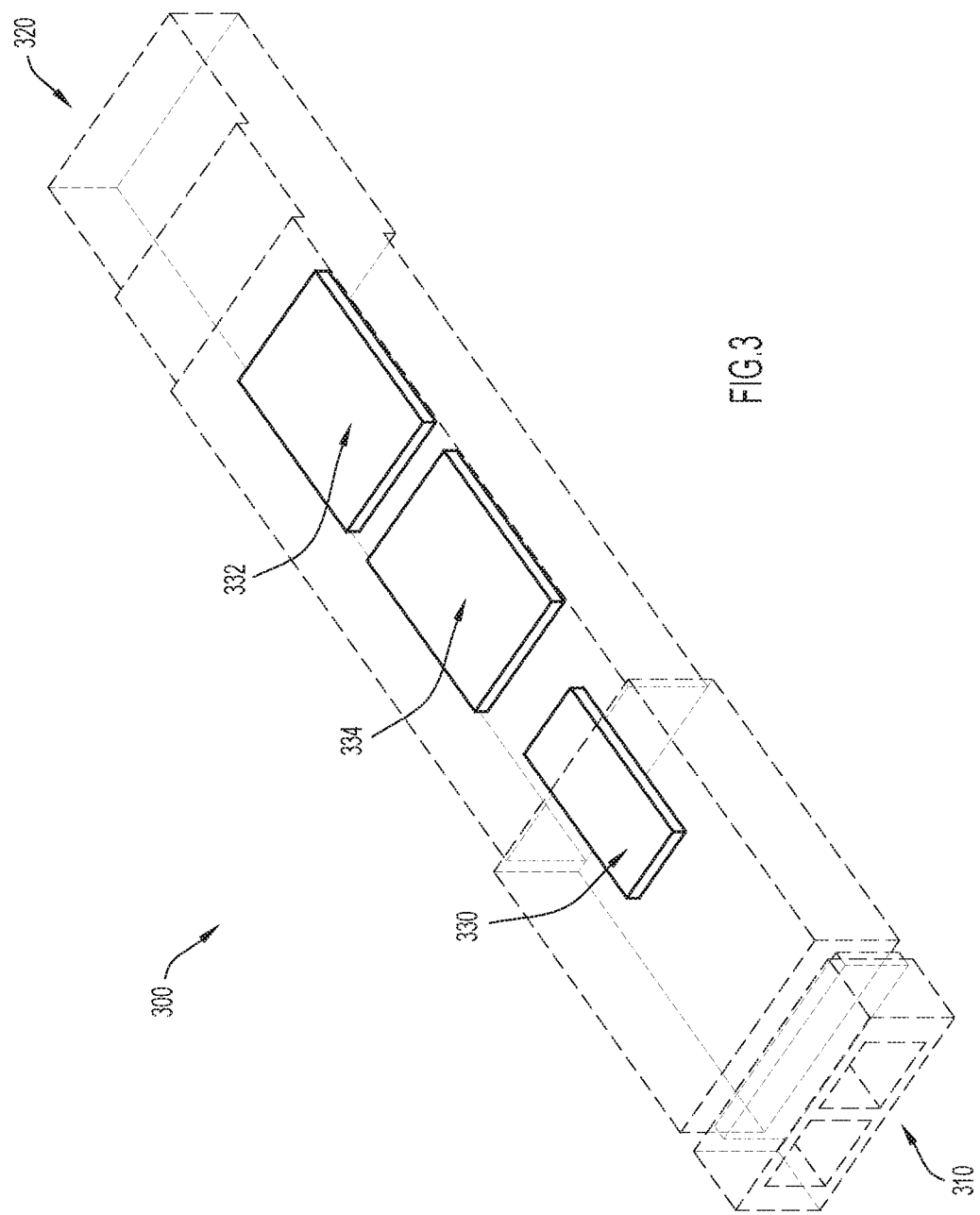

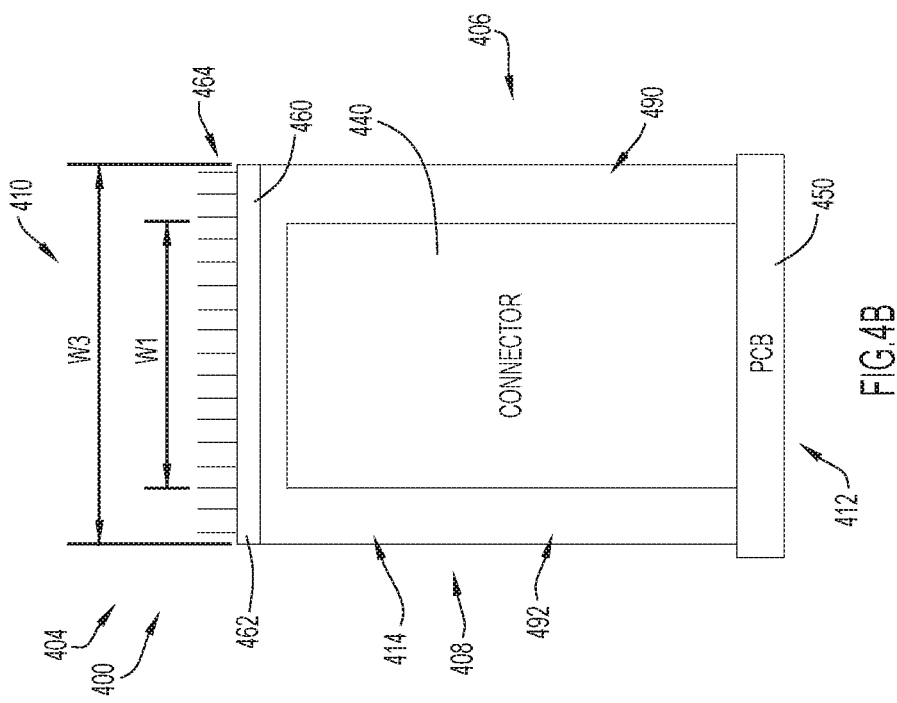
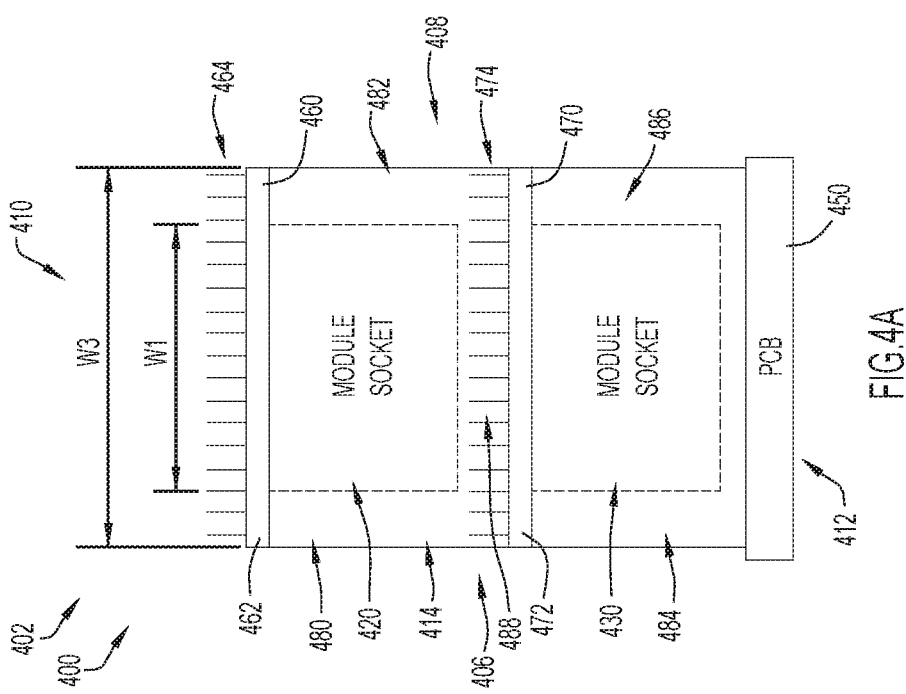
FIG.4B
FIG.4A

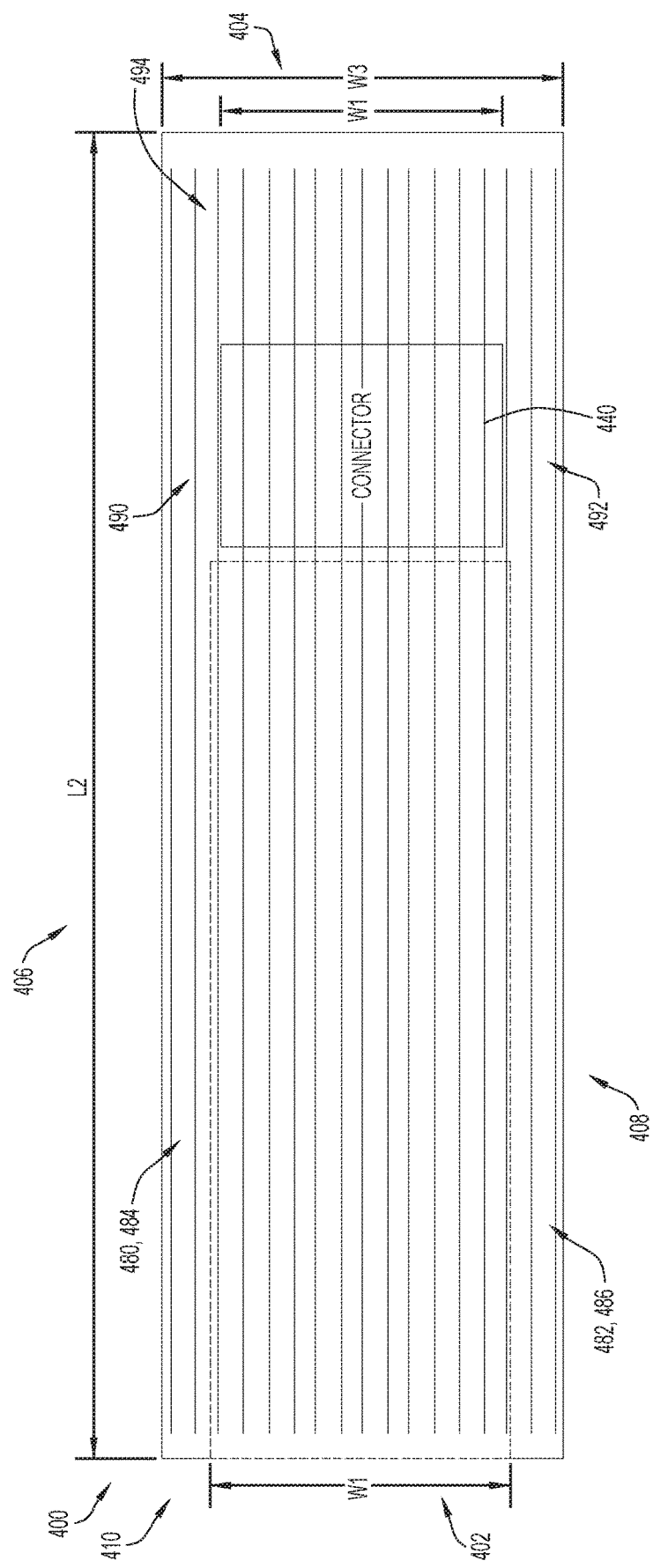

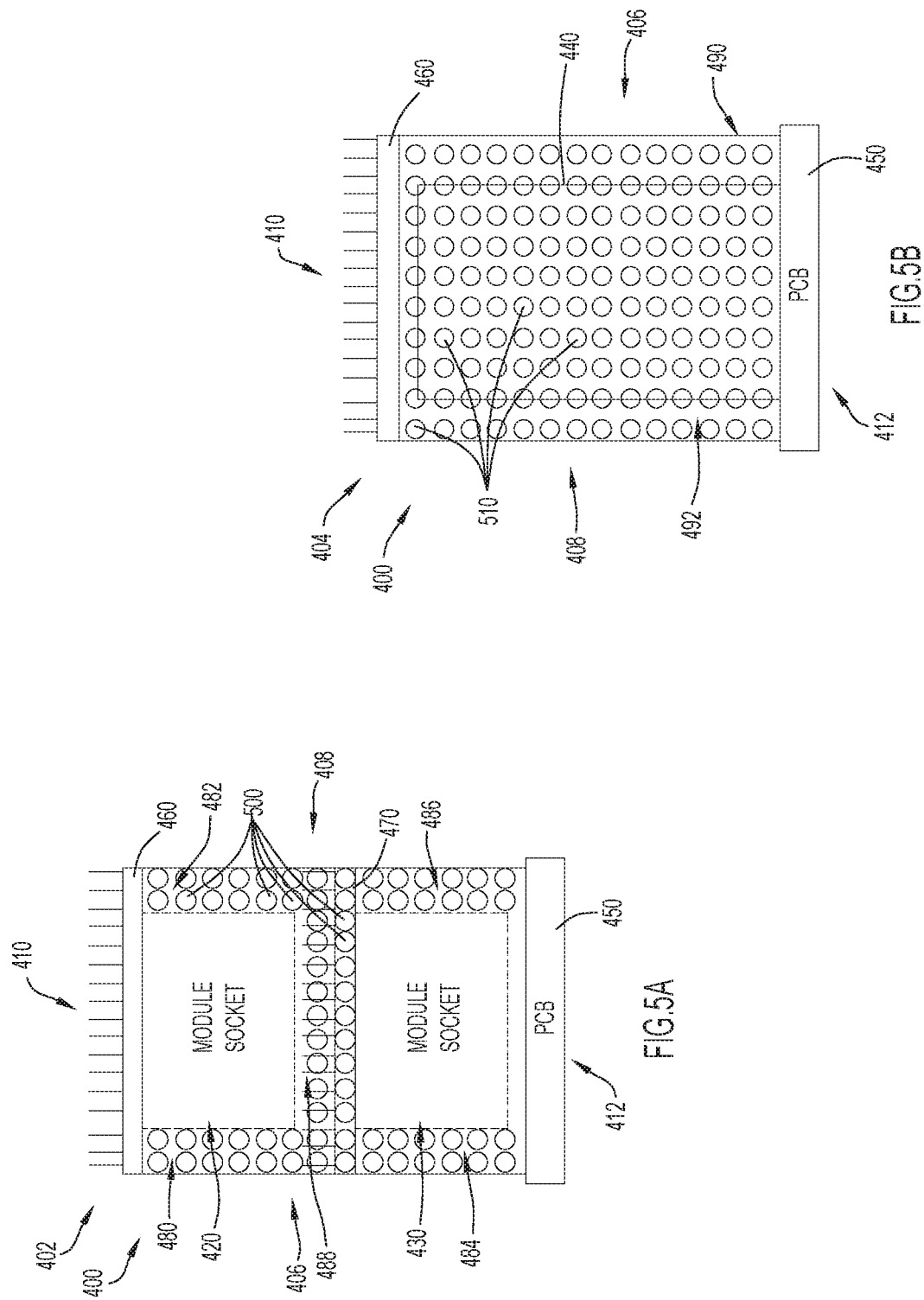

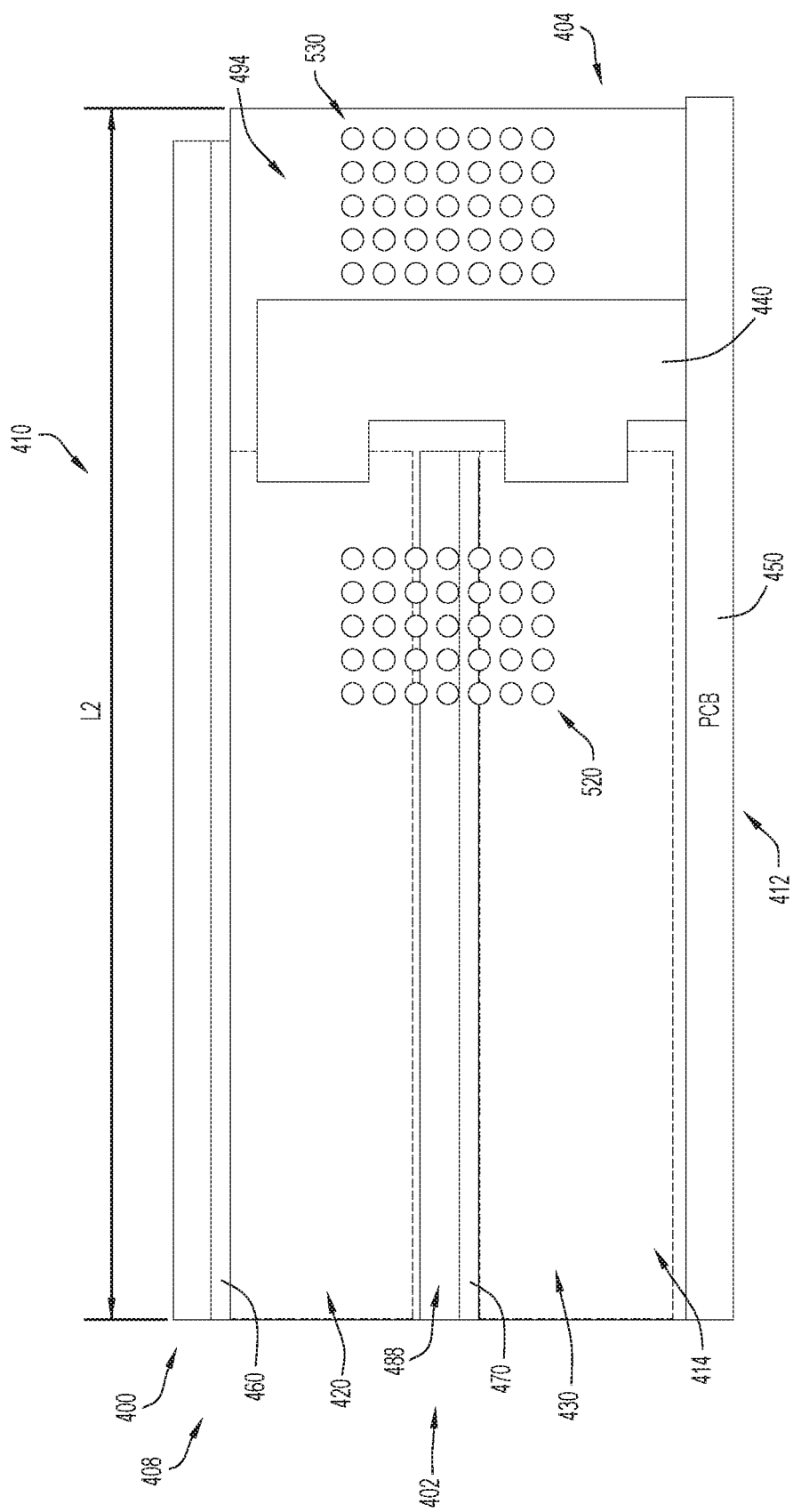

FIG.6

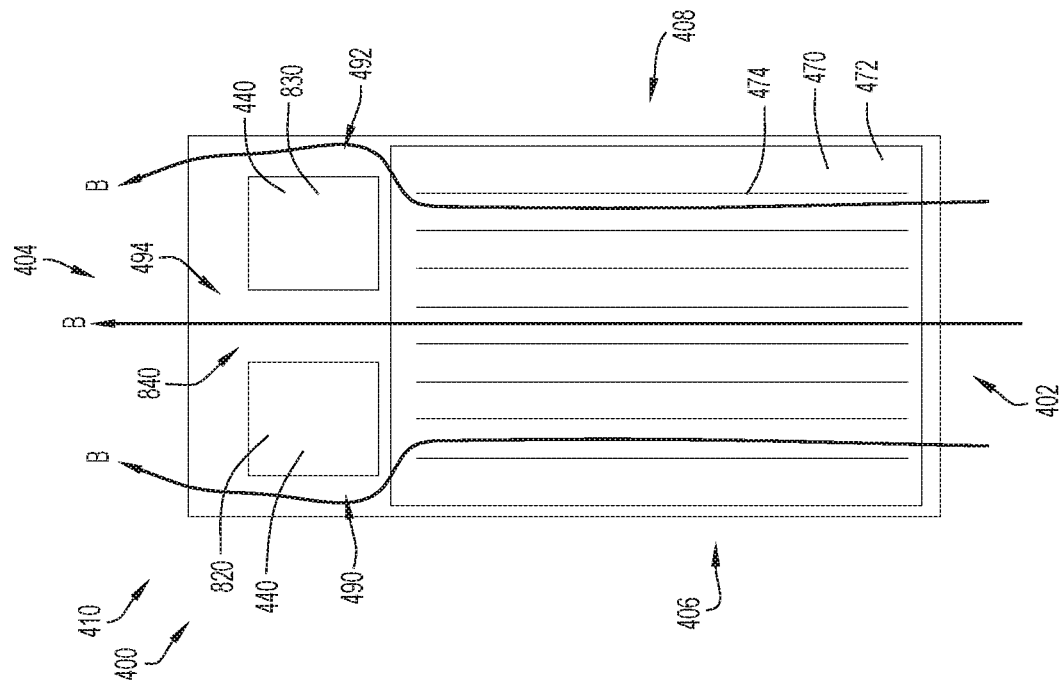
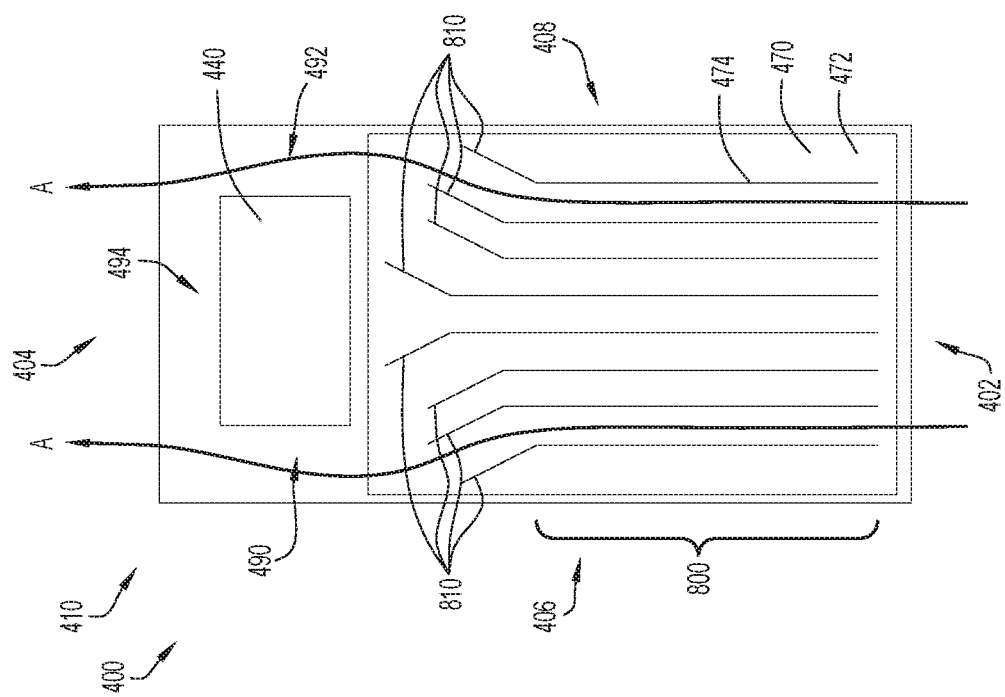

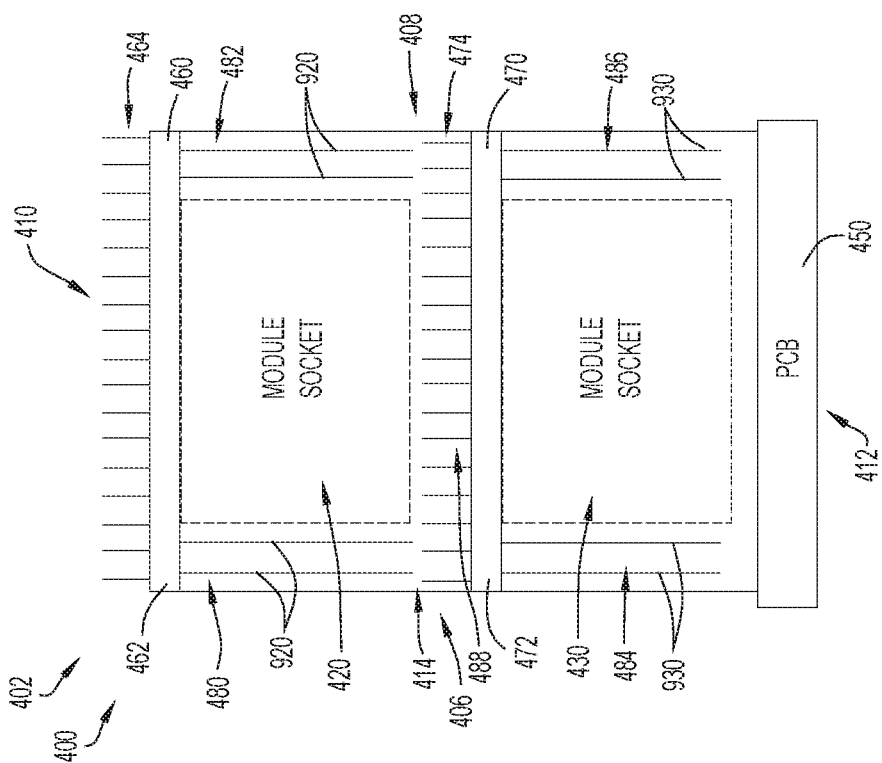
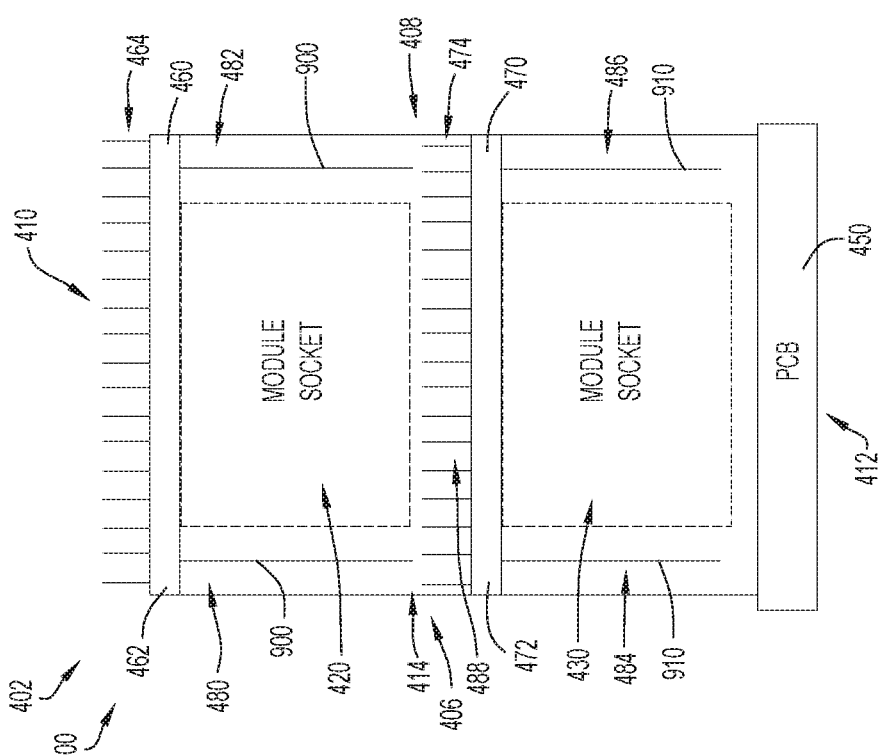

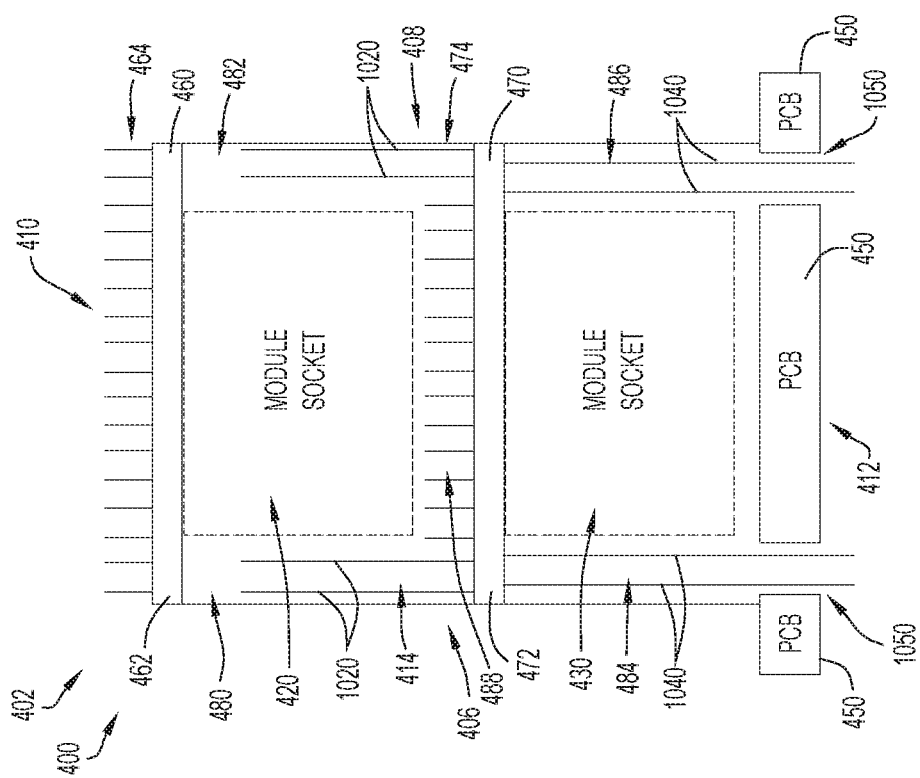

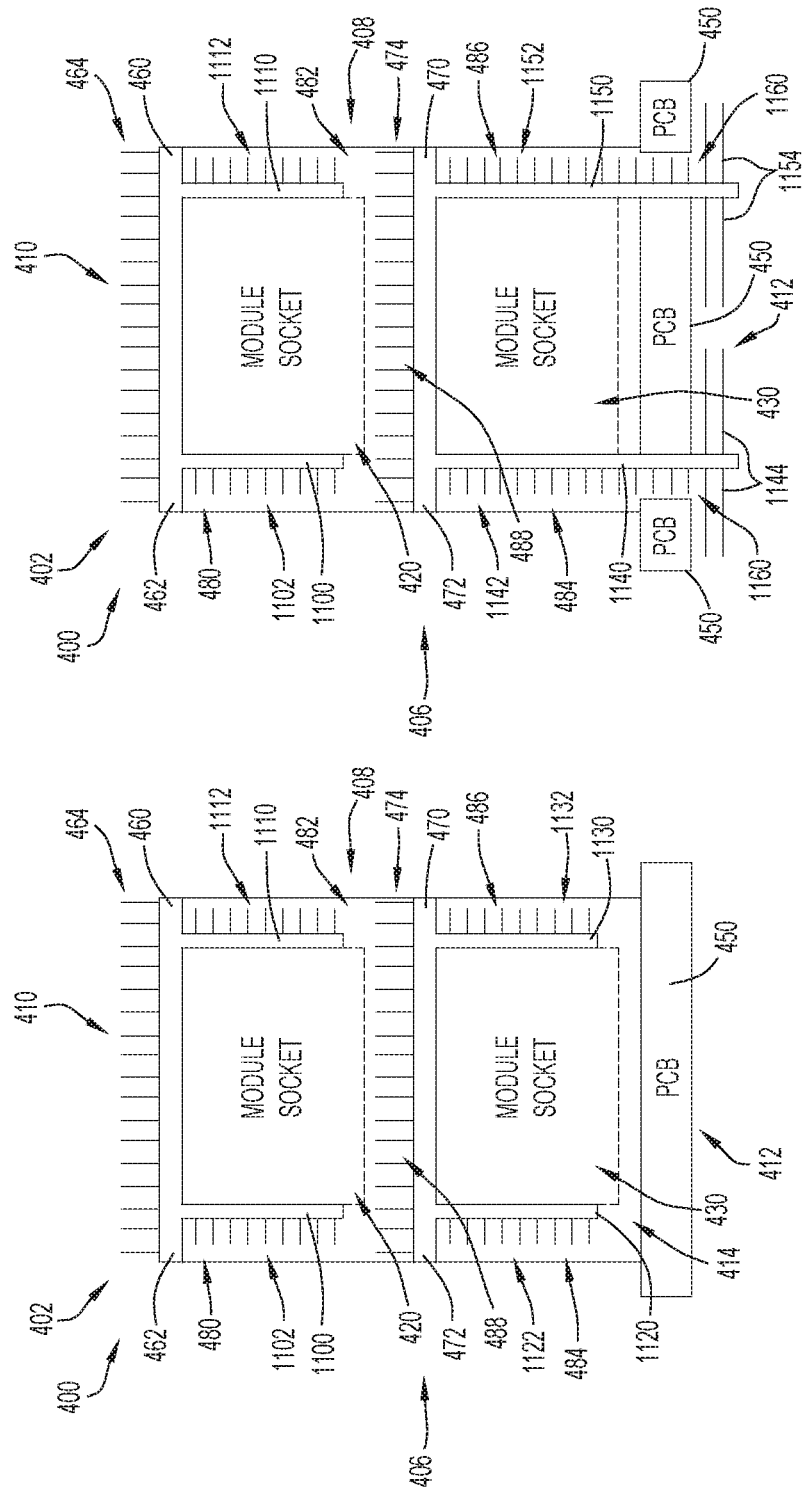

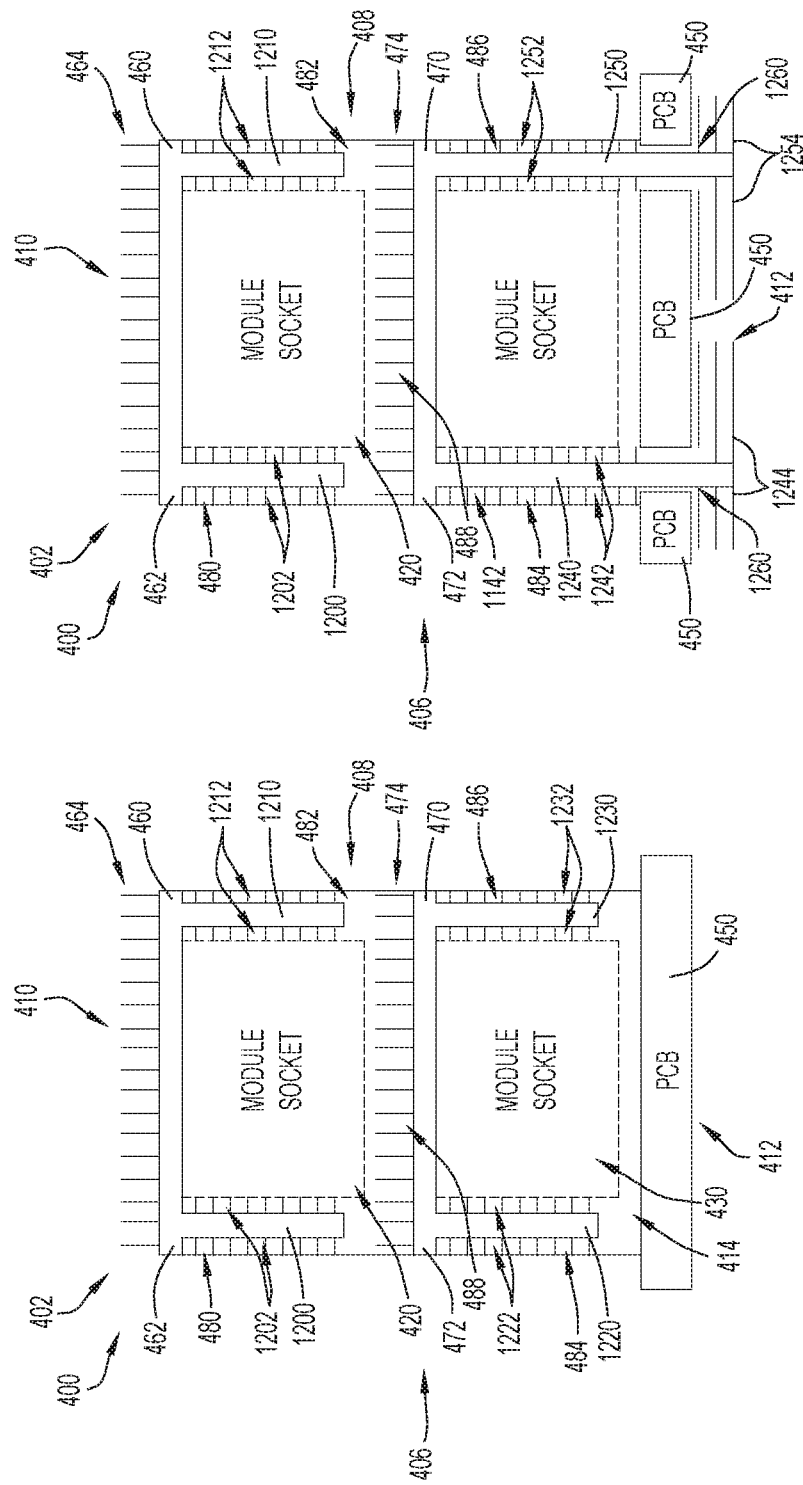

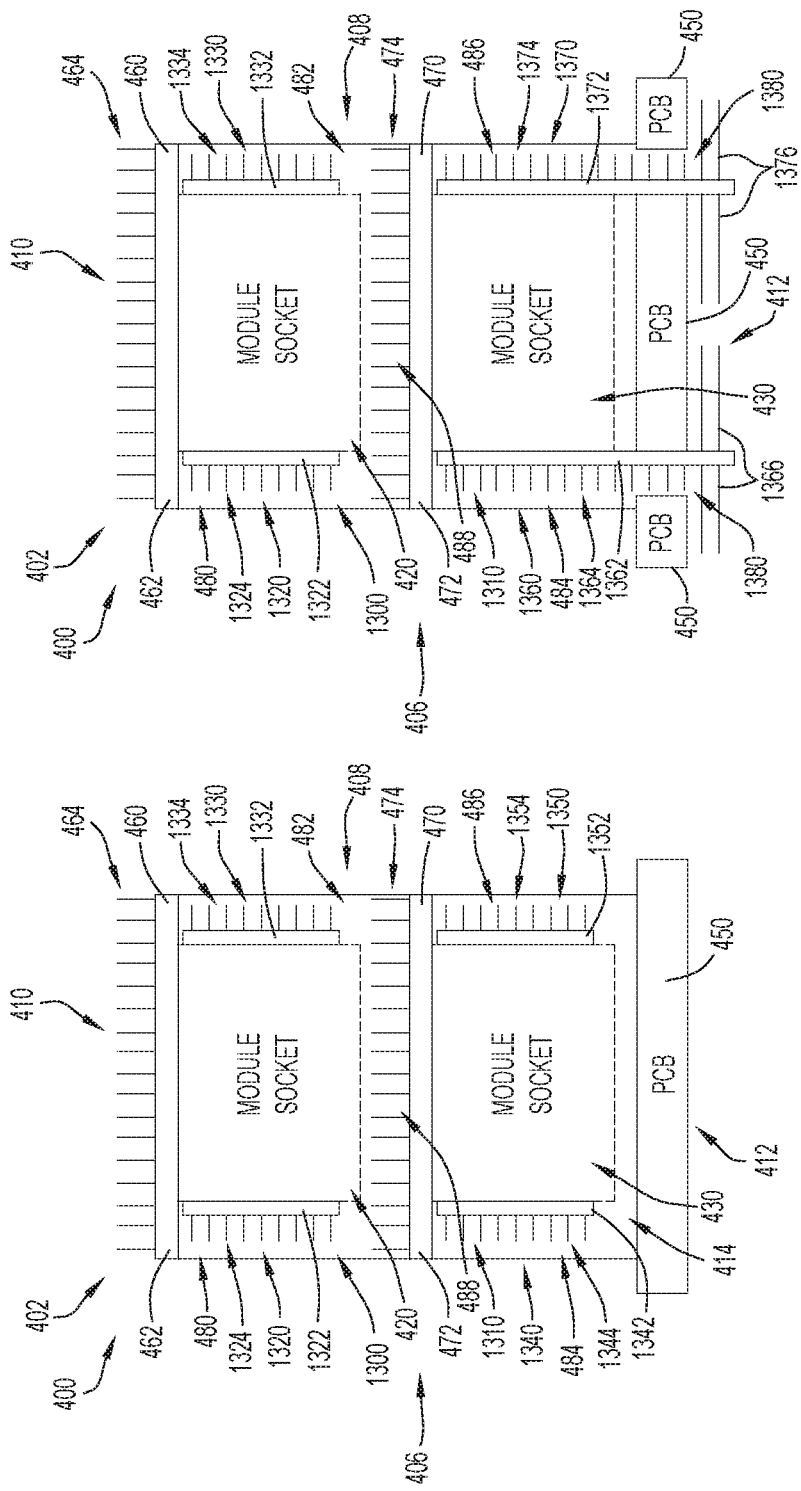

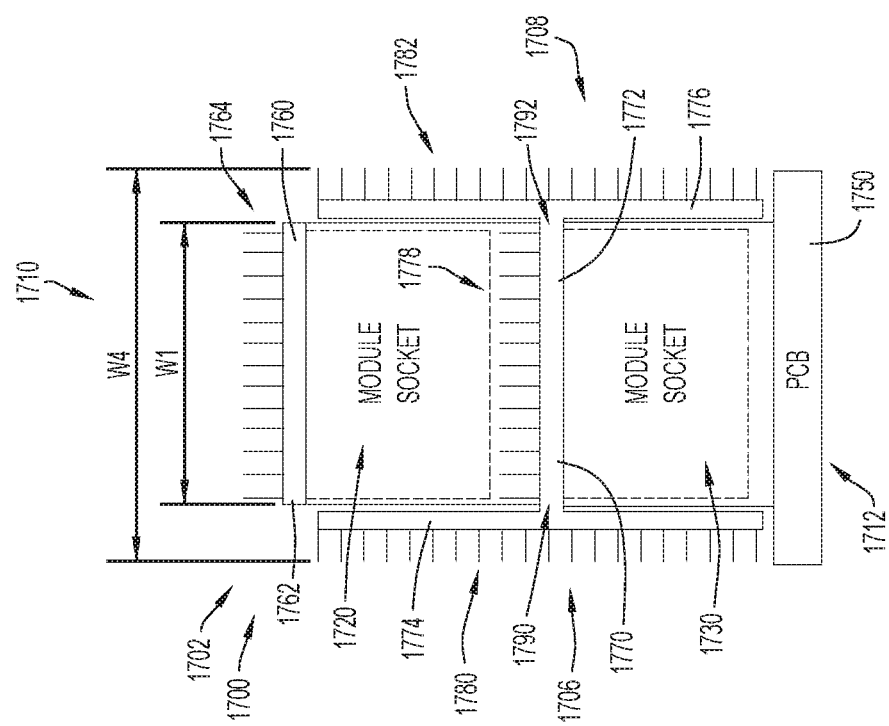

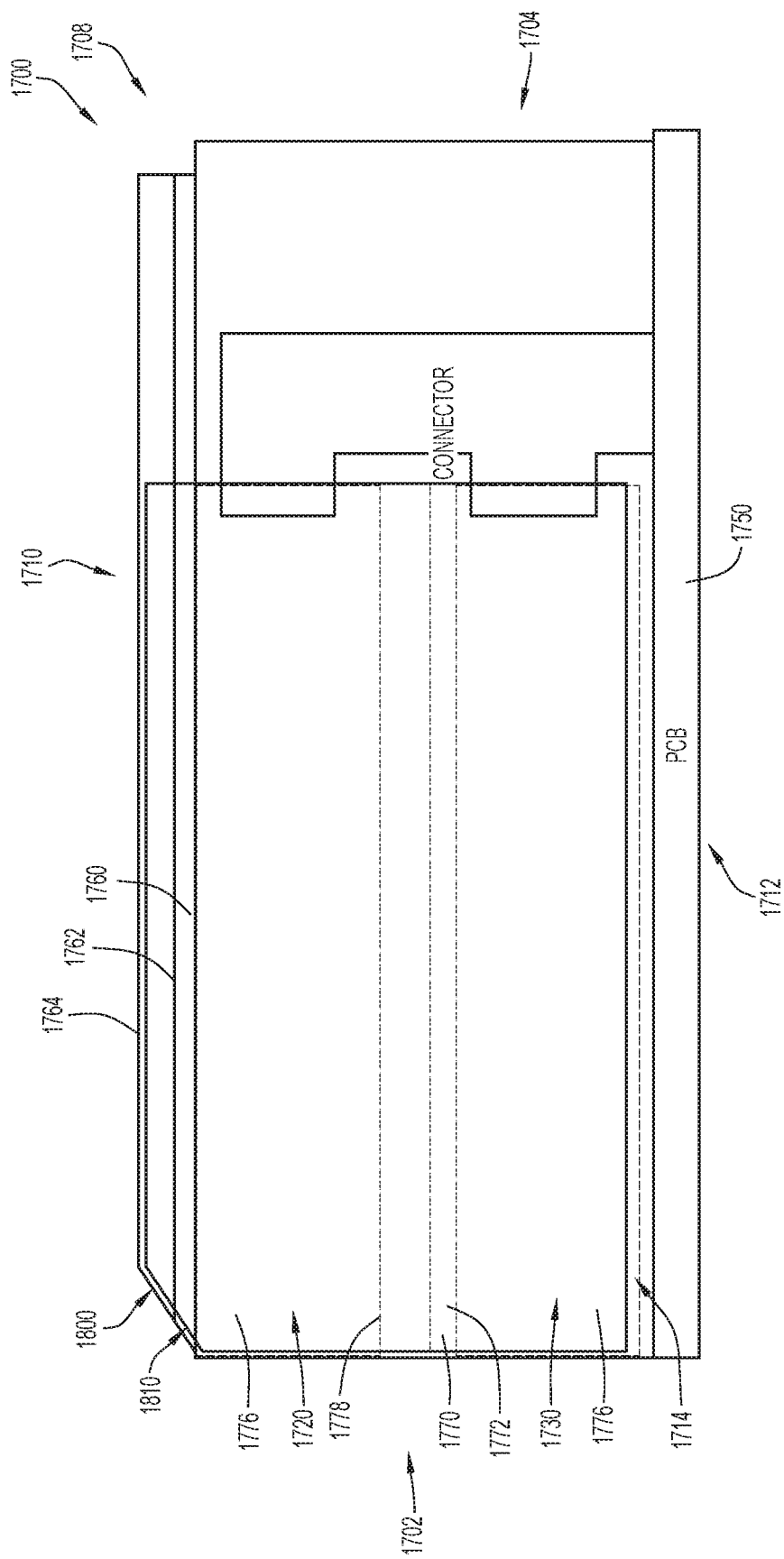

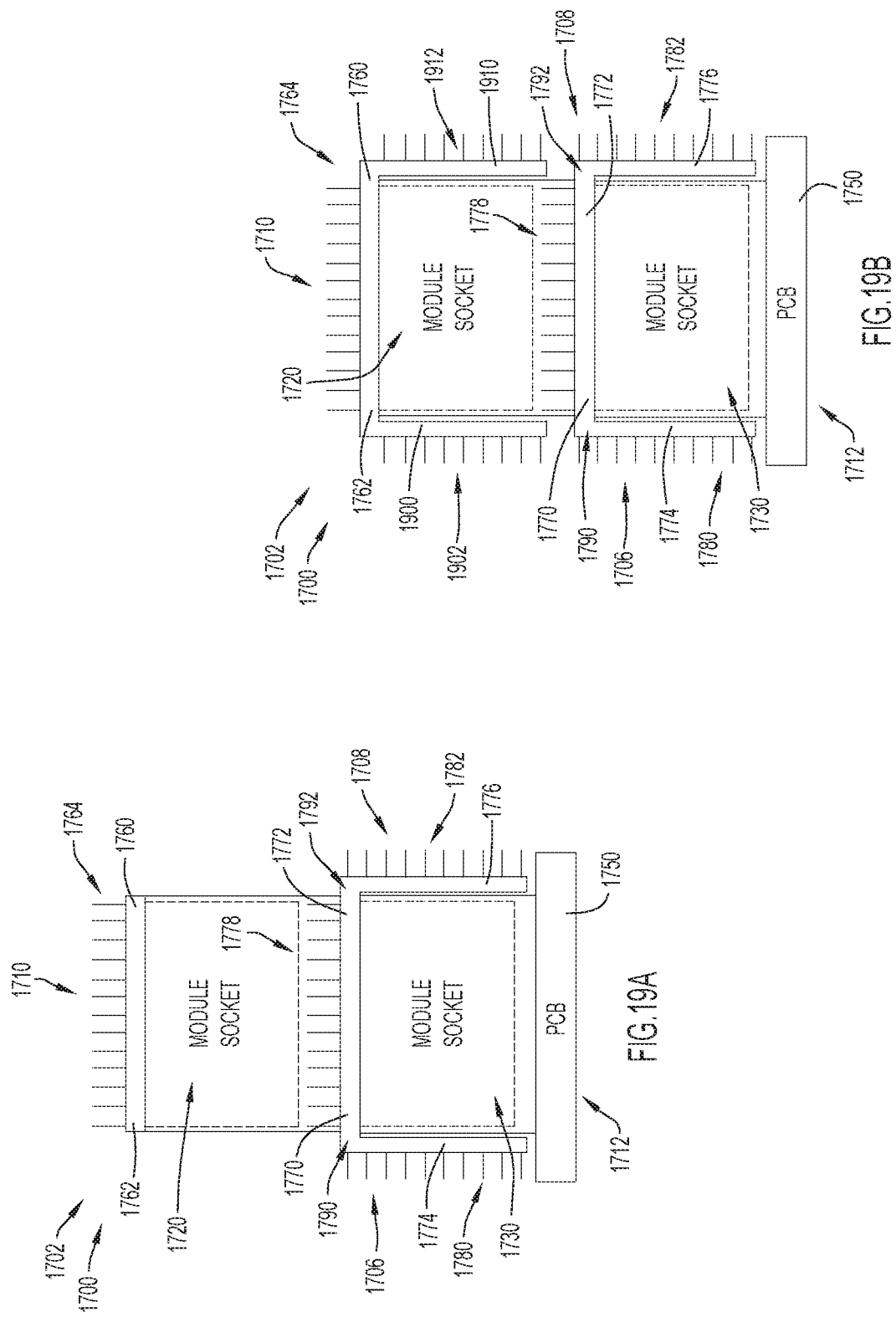

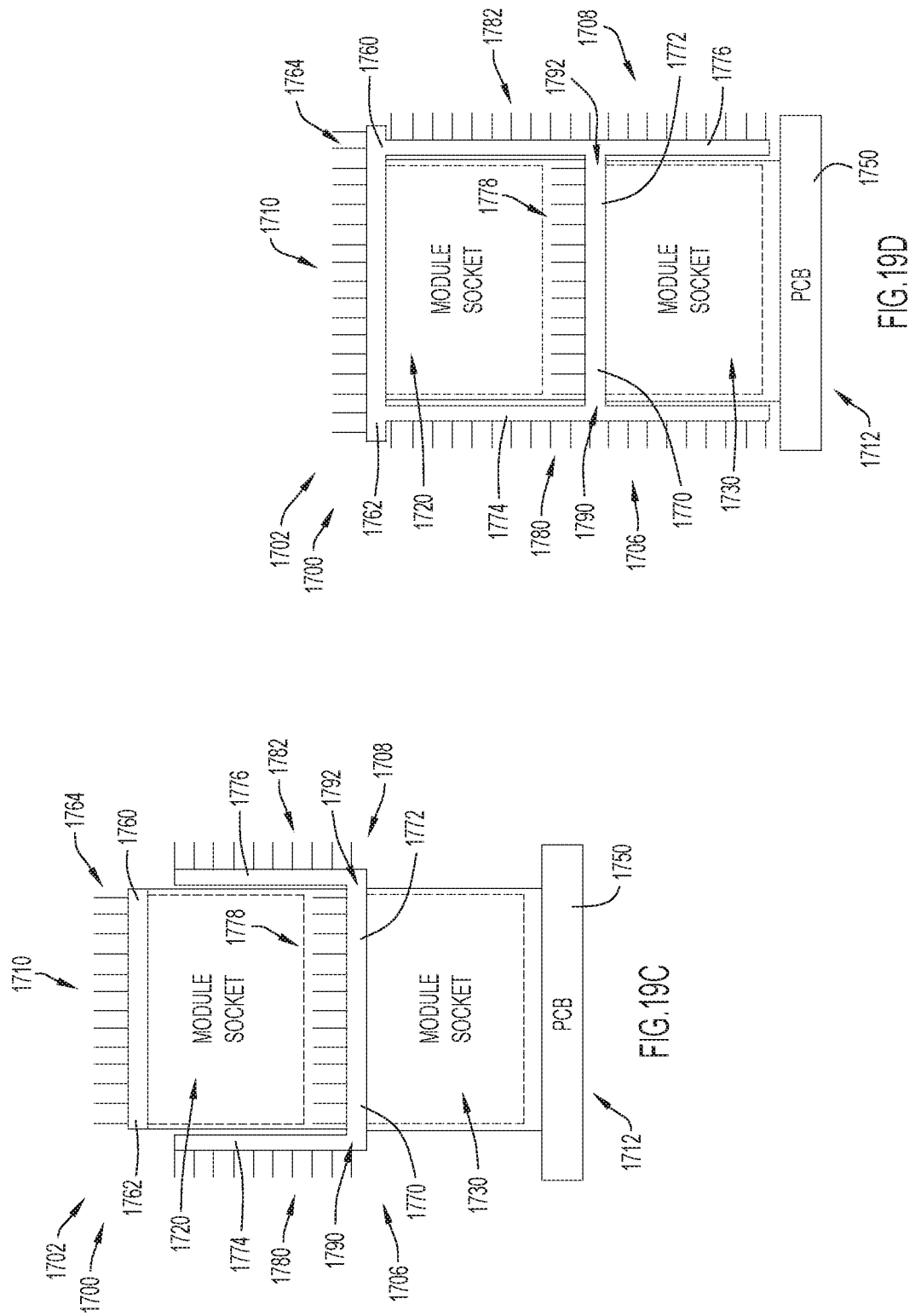

AIR COOLED CAGE DESIGN

PRIORITY CLAIM

This application is a continuation of U.S. patent application Ser. No. 16/922,177, filed on Jul. 7, 2020, and entitled "Improved Air Cooled Cage Design," which claims priority to U.S. Provisional Application No. 62/964,793, filed on Jan. 23, 2020, the entirety of which is incorporated herein by reference.

TECHNICAL FIELD

The present disclosure relates to cages for pluggable optical module.

BACKGROUND

As power density in optical modules continues to increase, optical modules used in various systems and network equipment are becoming more difficult to cool. Data rates supported by optical modules have increased, which has led to an increase in energy consumption by the optical modules. This in turn results in greater heat dissipation from the optical modules. As demand rises for even higher data rates, air cooling pluggable optical modules with conventional cage designs has become more and more challenging.

BRIEF DESCRIPTION OF THE DRAWINGS

FIG. 1C illustrates a schematic side view of the conventional optical module cage illustrated in FIG. 1A.

FIG. 3 is a diagram of a pluggable optical module and the associated heat dissipating components within the pluggable optical module.

FIG. 4A illustrates a schematic front view of an optical module cage in a 2×1 stacked configuration with riding heatsinks, according to an example embodiment.

FIG. 4B illustrates a schematic rear view of the optical module cage illustrated in FIG. 4A.

FIG. 4D illustrates a schematic top view of the optical module cage illustrated in FIG. 4A.

FIGS. 5A-5D illustrate views of the optical module cage illustrated in FIG. 4A and the series of perforations disposed on the optical module cage illustrated in FIG. 4A in accordance with an example embodiment.

FIG. 6 illustrates a schematic diagram of a faceplate including three of the optical module cages illustrated in FIG. 4A, according to an example embodiment.

FIGS. 8A and 8B illustrate top views of the lower heatsink and connector of the optical module cage illustrated in FIG. 4A, in accordance with example embodiments.

FIGS. 9A-9C illustrate front views of the heatsinks of the optical module cage illustrated in FIG. 4A, where the heatsinks have fins that extend in opposing directions, in accordance with example embodiments.

FIGS. 10A-10C illustrate schematic front views of the heatsinks of the optical module cage illustrated in FIG. 4A, where the lower heatsinks are substantially H-shaped, in accordance with example embodiments.

FIGS. 11A, 11B, 12A, and 12B illustrate front views of the heatsinks of the optical module cage illustrated in FIG. 4A, where the heatsinks are substantially U-shaped, in accordance with example embodiments.

FIGS. 13A and 13B illustrate schematic front views of the heatsinks of the optical module cage illustrated in FIG. 4A, where each optical module socket contains three riding heatsinks, in accordance with example embodiments.

FIG. 17C illustrates a schematic front view of the optical module cage illustrated in FIG. 17A, in accordance with an example embodiment.

FIG. 18 illustrates a schematic side view of the heatsinks of the optical module cage illustrated in FIG. 17A, where the optical module cage is used with an angled faceplate in accordance with an example embodiment.

FIGS. 19A-19D illustrates schematic front views of additional example embodiments of the heatsinks of the optical module cage illustrated in FIG. 17A, where the lower riding heatsink extends through the sidewalls of the optical module cage.

DESCRIPTION OF EXAMPLE EMBODIMENTS

Overview

Presented herein are mechanisms and cage designs for improving the air cooling of pluggable optical modules disposed within optical module cages. The mechanisms presented herein enable efficient air cooling of higher power pluggable optical modules by enhancing airflow (e.g., rates and/or patterns) through optical module cages and using multiple configurations that maximize heatsink contact with the pluggable optical modules and increase the heat dissipating surface area of the heatsink.

In one embodiment, a receptacle assembly may include a receptacle cage and a heatsink. The receptacle cage may have a first sidewall and a second sidewall that may define an interior cavity. The receptacle cage may have a first width spanning between the first sidewall and the second sidewall. The heatsink may be at least partially disposed within the interior cavity of the receptacle cage. Moreover, the heatsink may have a second width that is greater than the first width of the receptacle cage.

In another embodiment, a receptacle assembly may include a receptacle cage and a heatsink. The receptacle cage may have a plurality of sidewalls that define an interior cavity. The heatsink may have a first portion and a second portion. The first portion of the heatsink may be at least partially disposed within the interior cavity of the of the receptacle cavity, and may extend through at least one of the sidewalls of the plurality of sidewalls of the receptacle cage. The second portion of the heatsink may be disposed outside of the receptacle cage.

In yet another embodiment, a receptacle assembly may include a receptacle cage, at least one socket region, and a heatsink. The receptacle cage may have a front face, a first sidewall, a second sidewall, and a rear face that define an interior cavity. The at least one socket region may be disposed within the interior cavity of the receptacle cage proximate to the front face of the receptacle cage. Furthermore, the heatsink may have a first portion and a second portion. The first portion of the heatsink may be in abutment with the at least one socket region. The second portion of the heatsink may be disposed outside of the interior cavity.

Example Embodiments

Figure 1B:
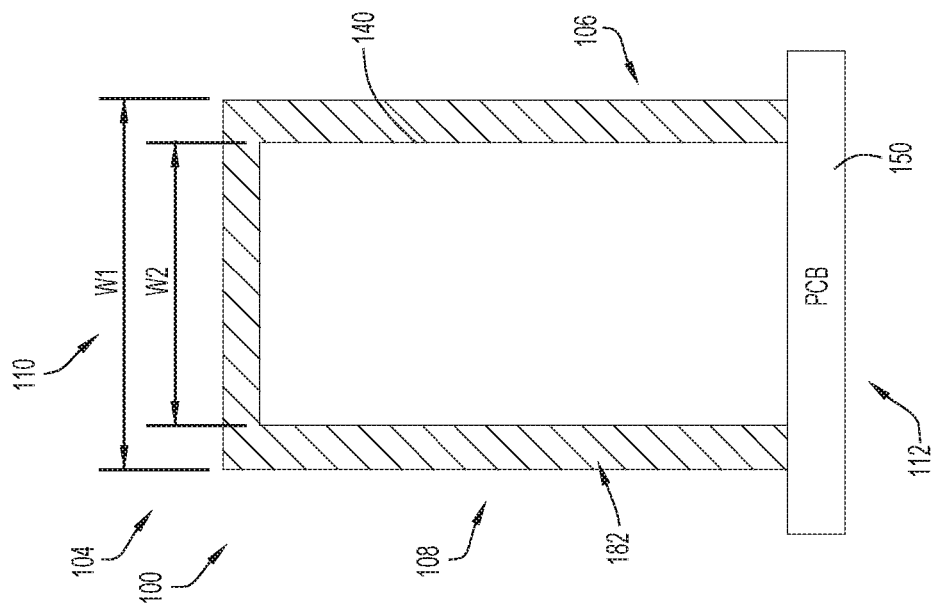
FIG. 1B illustrates a schematic rear view of the conventional optical module cage illustrated in FIG. 1A.
Figure 1A:
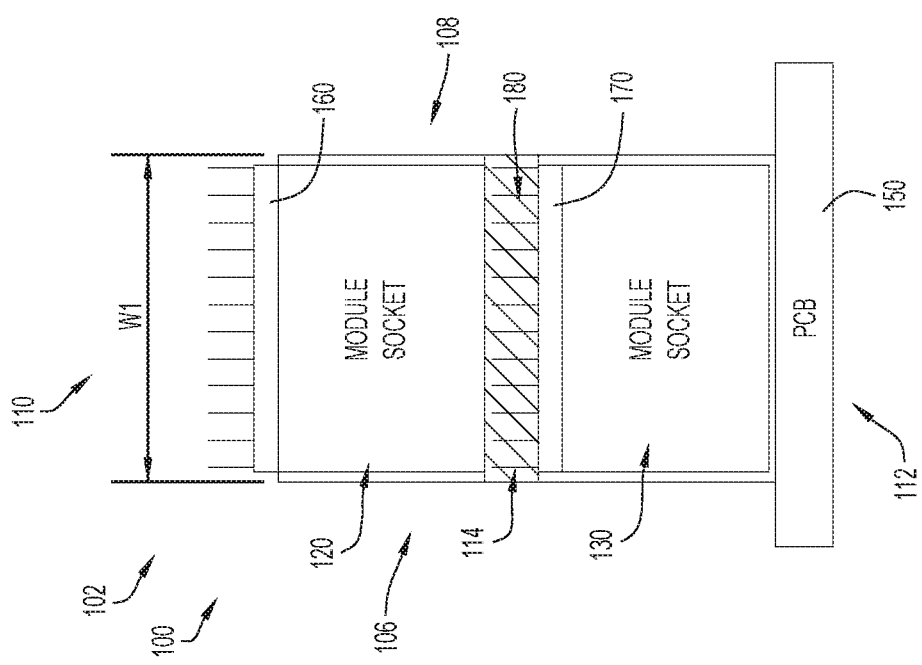
FIG. 1A illustrates a schematic front view of a conventional optical module cage in a 2×1 stacked configuration with riding heatsinks.

Illustrated in FIGS. 1A-1C are schematic views of a conventional optical module cage 100 in a 2×1 configuration. The conventional optical module cage 100 includes a front side 102, a rear side 104, a first side 106, a second side 108, a top side 110, and a bottom side 112 that collectively define an interior cavity 114. Disposed within the interior cavity 114 is a first module socket region 120 and a second module socket region 130, where the first and second module socket regions 120, 130 are open at the front side 102 of the cage 100, and extend along the first and second sides 106, 108 to a host-board connector 140 disposed within the interior cavity 114 of the cage 100 proximate to the rear side 104. The host-board connector 140 may be, in some embodiments, a Quad Small Form-Factor Pluggable-Double Density (hereinafter "QSFP-DD") host-board connector for connecting/interfacing QSFP-DD optical modules with electronic components, including, but not limited to, a printed circuit board (hereinafter "PCB") 150 upon which the cage 100 is disposed. Optical modules may be inserted through the front side 102 of the cage 100 such that the optical modules are disposed in one of the two socket regions and connected to the host-board connector 140.

Continuing with the conventional optical module cage illustrated in FIGS. 1A-1C, the conventional optical module cage 100 may further include multiple riding heatsinks 160, 170. As illustrated, the upper riding heatsink 160 is disposed on the top side 110 of the cage 100, and may be capable of at least partial abutment with an optical module disposed within, or plugged into, the first module socket region 120. The lower riding heatsink 170 may be disposed between the first module socket region 120 and the second module socket region 130, and may be capable of at least partial abutment with an optical module disposed within, or plugged into, the second module socket region 130.

As best illustrated in FIGS. 1A and 1B, the optical module cage 100 may have a width W1, which may be the dimensional spacing between the first and second sidewalls of the first and second sides 106, 108 of the cage 100. Moreover, the first and second module socket regions 120, 130, and the riding heatsinks 160, 170 may all have the same width, width W1, as that of the cage 100. The connector 140 may have a width W2 that is smaller than the width W1 of the cage 100, the first and second module socket regions 120, 130, and the riding heatsinks 160, 170, but the width W2 of the connector 140 may be large enough that when the connector 140 is disposed within the interior cavity 114 of the cage 100, the connector 140 spans a majority of the width W1 between the first and second sides 106, 108 of the cage 100 (i.e., the width W2 is minimally smaller than the width W1). As illustrated in FIG. 1C, the cage 100 may also have a length L1, which is the dimensional spacing of the front side 102 from the rear side 104.

Continuing with FIGS. 1A-1C, the cage 100 may be further equipped with perforations 180, 182, 184. As shown in FIG. 1A, a first set of perforations 180 may be disposed in the front side 102 proximate to the location of the lower heatsink 170 to promote airflow through the lower heatsink 170 to cool the second socket region 130. As shown in FIG. 1B, a second set of perforations 182 may be disposed along the sides and along the top of the rear side 104 of the cage 100. In other words, the second set of perforations 182 may be located along the border of the rear side 104 of the cage. The second set of perforations 182 may be configured to allow air that is capable of flowing around the connector 140 to flow out of the rear side 104 of the cage 100. Because the connector 140 takes up such a large portion of the width W1 of the cage 100, and because the connector 140 is disposed within the interior cavity 114 of the cage 100 in such proximity to the rear side 104 of the cage 100, the second set of perforations 182 are only disposed along the border of the rear side 104 of the cage 100 because cooling air does not travel directly behind the connector 140. Furthermore, due to these cage 100 and connector 140 width dimensions, the connector 140 inhibits the flow of air through the entire length of the cage 100 and limits the amount of cooling air traveling out of rear side 104 of the cage 100, especially for cooling air flowing along the lower riding heatsink 170. As further shown in FIG. 1C, a third set of perforations are located on the second side 108 of the cage 100 in the sidewall of the cage 100 to facilitate air traveling through the interior cavity 114 of the cage 100 to exit the interior cavity 114 of the cage 100 prior to reaching the connector 140. While not illustrated, the first side 106 of the cage 100 may be substantially similar to the second side 108 of the cage 100 such that the first side 106 of the cage 100 also includes a set of perforations in the sidewall that are substantially similar to the third set of perforations 184 and located in a substantially similar location.

Figure 2:
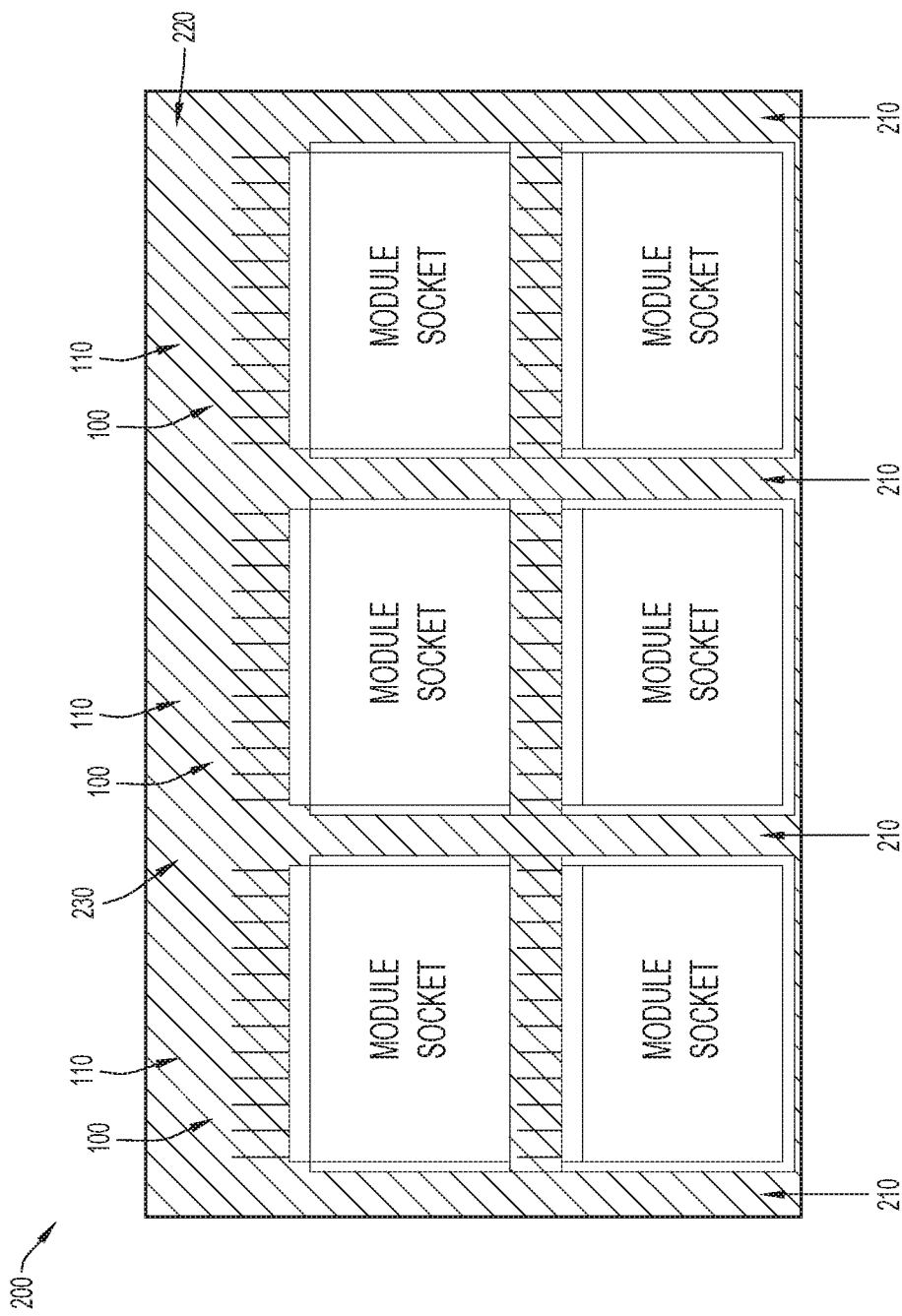
FIG. 2 illustrates a schematic diagram of a faceplate including three of the conventional optical module cages illustrated in FIG. 1A.

The conventional module cage 100 illustrated in FIGS. 1A-1C was invented to enable up to a 36×400 Gb/s data rate in a 1 Rack Unit (RU) faceplate. Turning to FIG. 2, and with continued reference to FIGS. 1A-1C, illustrated is an example schematic front view of a portion of a faceplate 200 with three conventional optical module cages 100. As illustrated in FIG. 2, the cages 100 are spaced from one another along the faceplate 200 such that interstitial gaps 210 are disposed between each of the cages 100. Moreover, the faceplate 200 has a height that is greater than the height of the cages 100 such that an upper gap 220 is disposed between the top of the faceplate 200 and the top side 110 of the cages 100. As further illustrated in FIG. 2, the faceplate 200 may contain a series of perforations 230 that are disposed across the faceplate 200 such that the series of perforations 230 are oriented in front of the interstitial gaps 210 and the upper gap 220.

With the conventional optical module cage 100 illustrated in FIGS. 1A-1C and the faceplate 200 illustrated in FIG. 2, air passes through the series of perforations 230. A portion of the air may flow through the interstitial gaps 210 and the upper gap 220, while another portion of the air may enter the cage 100 via the first set of perforations 180. The air that enters through the upper gap 220 may flow through the upper riding heatsink 160 to cool a pluggable module disposed within the first module socket region 120. The air that flows into the first set of perforations 180 may flow through the lower riding heatsink 170 to cool a pluggable module disposed within the second module socket region 130. However, as previously explained, because of cage 100 and connector 140 width dimensions, the connector 140 inhibits the flow of air through the lower riding heatsink 170 by forcing the air to flow through slim slots on the sides of the connector 140 (i.e., between the sidewall of the first side 106 of the cage 100 and the connector 140, and between the sidewall of the second side 108 of the cage 100 and the connector 140). The portion of the cooling air flowing through the interstitial gaps 210 may displace any heat that has transferred through the sides 106, 108 of the cage 100.

The conventional optical module cage 100 is generally designed to cool pluggable modules that use approximately 8 W-15 W of power. As mentioned previously, power used by pluggable optical modules has increased over time as the data rates handled by the pluggable optical modules continue to increase. For example, a Quad Small Form-Factor Pluggable (QSFP) optical module may have dissipated 2.5 W of power when employed, but QSFP-DD optical modules are capable of consuming more than 20 W of power when employed. Illustrated in FIG. 3 is a schematic drawing of a QSFPP-DD optical module 300 and the heat generating internal components of the QSFP-DD optical module 300. As illustrated in FIG. 3, the QSFP-DD optical module 300 includes a first end 310 and a second end 320. Disposed within the QSFP-DD optical module 300 may be a plurality of components 330, 332, 334 that are capable of generating heat during operation of the optical module 300. While FIG. 3 illustrates that the QSFP-DD optical module 300 contains three components 330, 332, 334 capable of generating heat, other pluggable optical modules may contain any number of heat generating internal components. In the embodiment illustrated in FIG. 3, the first component 330 may be disposed more proximate to the first end 310 of the QSFP-DD optical module 300 than the second end 320 of the QSFP-DD optical module 300. Conversely, the second component 332 may be disposed more proximate to the second end 320 of the QSFP-DD optical module 300 than the first end 310 of the QSFP-DD optical module 300. The third component 334 may be disposed between the first component 330 and the second component 332. For the QSFP-DD optical module 300 embodiment illustrated, the first component 330 may generate approximately 30% of the total power output by the module 300 when it is employed, the second component may generate approximately 20% of the total power output by the module 300 when it is employed, and the third component may generate approximately 50% of the total power output by the module 300 when it is employed. The embodiment of the QSFP-DD optical module 300 illustrated in FIG. 3 may be capable of generating a total power output that is over ten times the amount of power generated by the pluggable modules in which the conventional optical module cages 100 were designed to cool.

An example embodiment of an improved optical module cage capable of adequately cooling optical modules that handle increased data rates and output large amounts of heat (i.e., QSFP-DD optical modules) is illustrated in FIGS. 4A-4D, and shown generally as reference numeral 400. Like the conventional optical module cage 100 illustrated in FIGS. 1A-1C, the optical module cage 400 illustrated in FIGS. 4A-4D is in a 2×1 configuration, and includes a front side 402, a rear side 404, a first side 406, a second side 408, a top side 410, and a bottom side 412. The sides 402, 404, 406, 408, 410, 412 of the cage 400 collectively define an interior cavity 414 of the cage 400. Disposed within the interior cavity 414 is a first module socket region 420 and a second module socket region 430, where the first and second module socket regions 420, 430 are open at the front side 402 of the cage 400, and extend along the first and second sides 406, 408 to a host-board connector 440 disposed within the interior cavity 414 of the cage 400. The first and second module socket regions 420, 430 may be configured to receive pluggable optical modules such as, but not limited to, QSFP-DD optical modules. The host-board connector 140 may be, in some embodiments, a QSFP-DD host-board connector for connecting/interfacing QSFP-DD optical modules with electronic components, including, but not limited to, a printed circuit board (hereinafter "PCB") 450 upon which the cage 400 is disposed. Optical modules may be inserted through the front side 402 of the cage 400 such that the optical modules are disposed in one of the two module socket regions 420, 430 and connected to the host-board connector 440.

Figure 4C:
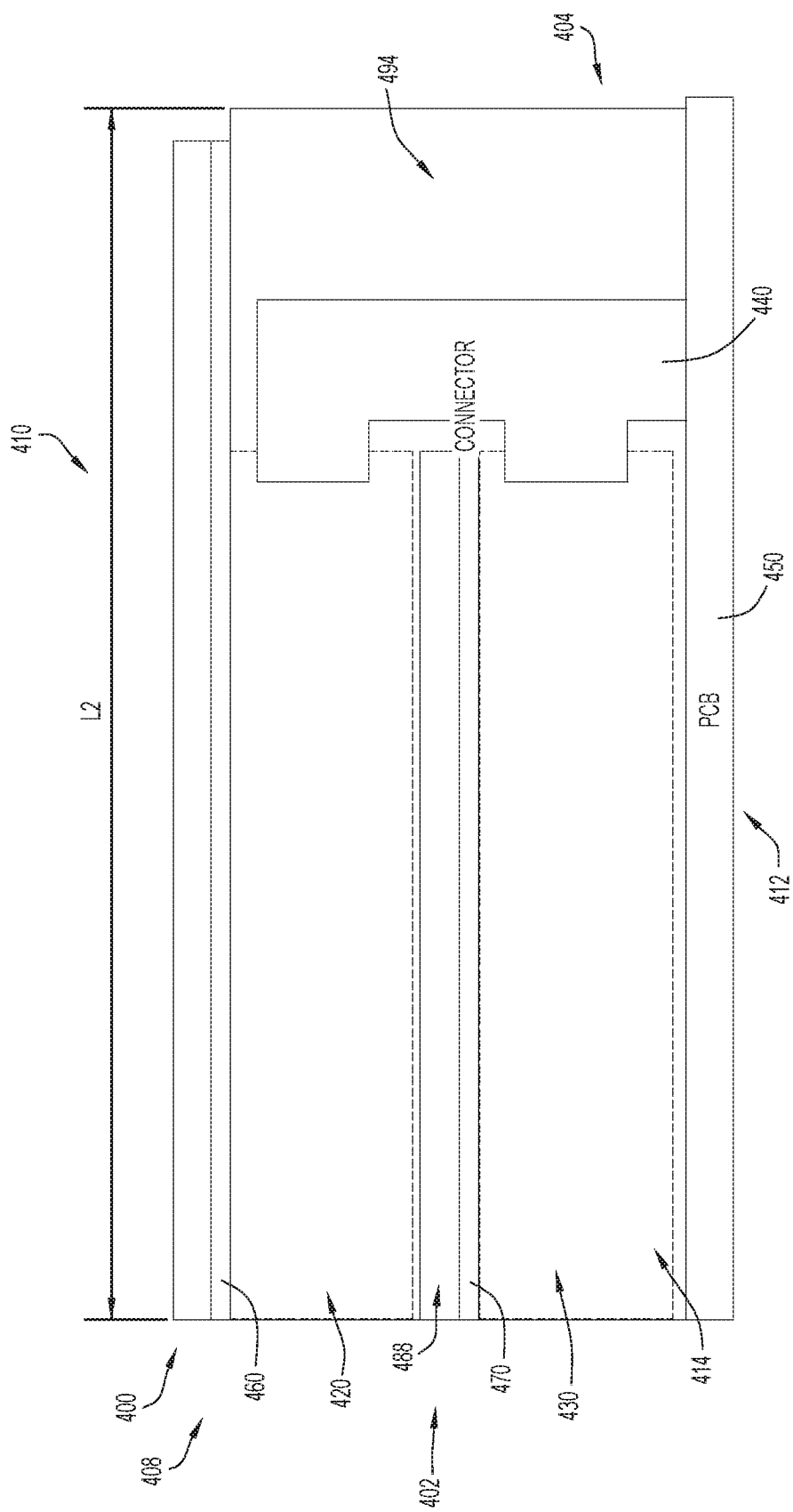
FIG. 4C illustrates a schematic side view of the optical module cage illustrated in FIG. 4A.

Continuing with FIGS. 4A-4D, the optical module cage 400 may further include multiple riding heatsinks 460, 470. As illustrated, the upper riding heatsink 460 is disposed on the top side 410 of the cage 400, and may be capable of at least partial abutment with an optical module disposed within, or plugged into, the first module socket region 420. The lower riding heatsink 470 may be disposed between the first module socket region 420 and the second module socket region 430, and may be capable of at least partial abutment with an optical module disposed within, or plugged into, the second module socket region 430. As best illustrated in FIGS. 4A and 4B, the upper riding heatsink 460 may have a base 462 and a series of fins 464 that extend vertically from the base 462. Similarly, the lower riding heatsink 470 may have a base 472 and a series of fins 474 that extend vertically from the base 472.

As best illustrated in FIGS. 4A, 4B and 4D, the optical module cage 400 may have a width W3, which may be the dimensional spacing between the first and second sidewalls of the first and second sides 406, 408 of the cage 400. This width W3 of the optical module cage 400 may be larger than the width W1 of the conventional optical module cage 100 illustrated in FIGS. 1A and 1B. As further illustrated in FIGS. 4A and 4B, the riding heatsinks 460, 470 may have the same width W3 as the cage 400. More specifically, the bases 462, 472 of the riding heatsinks 460, 470, respectively, have the same width W3 (i.e., the bases 462, 472 of the riding heatsinks 460, 470, respectively, span from the first side 406 of the cage 400 to the second side 408 of the cage 400). Moreover, while the cage 400 may have an increased width of W3 when compared to the conventional optical module cage 100 illustrated in FIGS. 1A-1C, the first and second module socket regions 420, 430 may still have a width W1, and the connector 440 may still have a width W2, both of which are smaller than the width W3 of the cage 400. The increased width of the riding heatsinks 460, 470 enables the heatsinks 460, 470 to more efficiently cool the optical modules in which the riding heatsinks 460, 470 are in abutment with because cooling air passes over a greater surface area of the heatsinks 460, 470, which allows the riding heatsinks 460, 470 to dissipate a greater amount of heat.

As best illustrated in FIGS. 4A, 4B, and 4D, the increased width of the cage 400 also creates a series of airflow passageways 480, 482, 484, 486 within the interior cavity 414 of the cage 400 in addition to the central airflow passageway 488 that is disposed between the first and second module socket regions 420, 430. The first airflow passageway 480 may be disposed between the sidewall of the first side 406 of the cage 400 and the first module socket region 420. In other words, when an optical module is plugged into the first module socket region 420, the first airflow passageway 480 may be defined by the first side 406 of the cage 400, the optical module, the upper heatsink 460, and the lower heatsink 470. The second airflow passageway 482 may be disposed between the sidewall of the second side 408 of the cage 400 and the first module socket region 420. In other words, when an optical module is plugged into the first module socket region 420, the second airflow passageway 482 may be defined by the second side 408 of the cage 400, the optical module, the upper heatsink 460, and the lower heatsink 470. The third airflow passageway 484 may be disposed between the sidewall of the first side 406 of the cage 400 and the second module socket region 430. In other words, when an optical module is plugged into the second module socket region 430, the third airflow passageway 484 may be defined by the first side 406 of the cage 400, the optical module, the lower heatsink 470, and the bottom side 412 of the cage 400 or PCB 450. The fourth airflow passageway 486 may be disposed between the sidewall of the second side 408 of the cage 400 and the second module socket region 430. In other words, when an optical module is plugged into the second module socket region 430, the fourth airflow passageway 486 may be defined by the second side 408 of the cage 400, the optical module, the lower heatsink 470, and the bottom side (bottom) 412 of the cage 400 or PCB 450. In some embodiments, the first and third airflow passageways 480, 484 may collectively define a single airflow passageway proximate to the first side 406 of the cage 400, while the second and fourth airflow passageways 482, 486 collectively define another single airflow passageway proximate to the second side 408 of the cage 400. In other embodiments, the series of airflow passageways 480, 482, 484, 486 and the central airflow passage 488 may be in fluid communication with one another.

The increased width of the cage 400 also increases the distance between the sides of the connector 440 and the first and second sides 406, 408 of the cage 400. This increased distance between the sides 406, 408 of the cage 400 and the connector 440 promotes an increased cooling airflow around the connector 440. As best illustrated in FIG. 4B, a fifth airflow passageway 490 is disposed between the sidewall of the first side 406 of cage 400 and the connector 440, while a sixth airflow passageway 492 is disposed between the sidewall of the second side 408 of cage 400 and the connector 440. Because the lower heatsink 470 only extends through the interior cavity 414 of the cage 400 from the front side 402 to the connector 440, the first and third airflow passageways 480, 484 both feed into the fifth airflow passageway 490, while the second and fourth airflow passageways 482, 486 both feed into the sixth airflow passageway 492. The increased width of the cage 400 promotes an increased flow (e.g., flowrate, volume, etc.) through the interior cavity 414 of the cage 400 and around the connector 440, which increases the cooling effect of the airflow across the heatsinks 460, 470 when compared to the convention optical module cage 100 illustrated in FIGS. 1A and 1B because the air can flow less inhibited through the interior cavity 414 of the cage 400.

Turning to FIGS. 4C and 4D, and with continued reference to FIGS. 1A, 1B, 1C, 4A, and 4B, the cage 400 may also have a length L2, which is the dimensional spacing of the front side 402 of the cage 400 to the rear side 404 of the cage 400. This length L2 of the cage 400 is larger than the length L1 of the conventional optical module cage 100 illustrated in FIG. 1C. Thus, as best illustrated in FIGS. 4C and 4D, the connector 440 is spaced from the rear side 404 of the cage 400 by a seventh airflow passageway 494. The fifth and sixth airflow passageways 490, 492 may feed into the seventh airflow passageway 494.

Figure 5D:
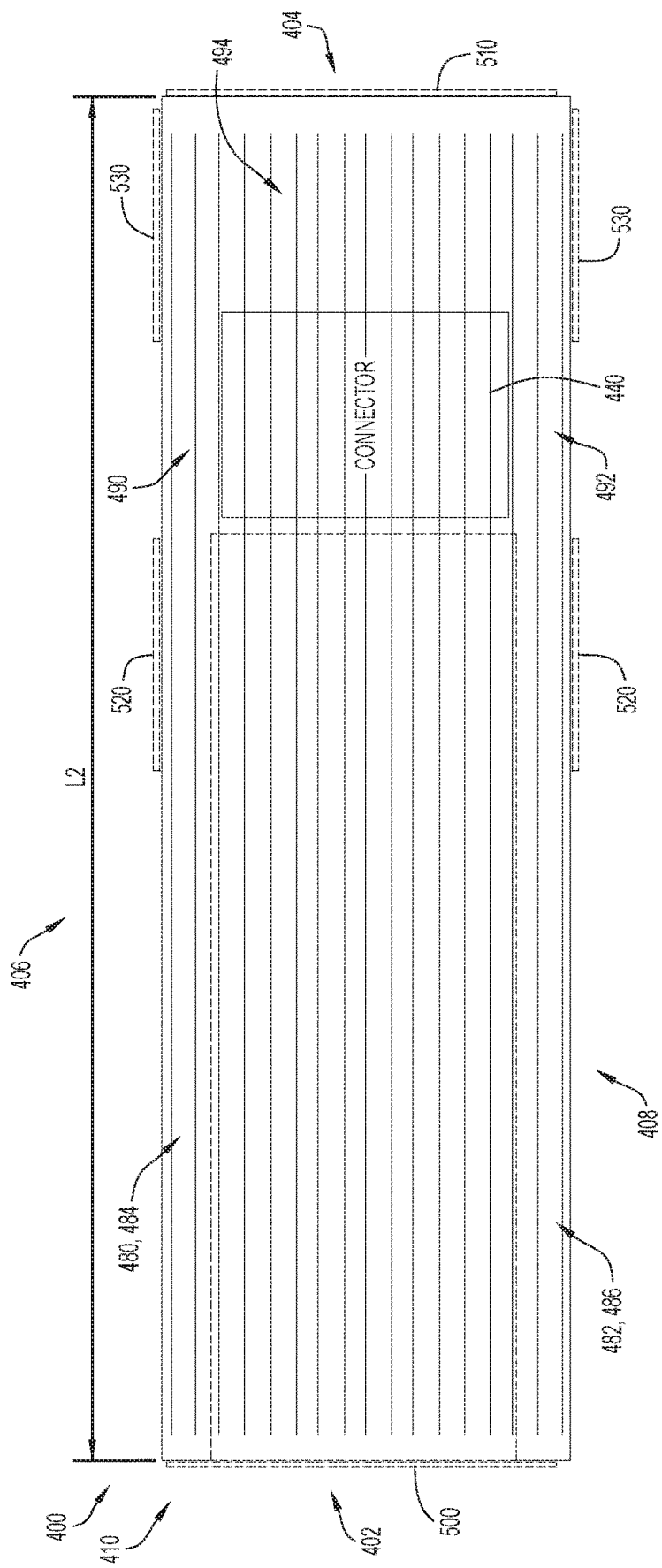

Turning to FIGS. 5A-5D, and with continued reference to FIGS. 4A-4D, the cage 400 may include a series of perforations that further improve the flow of cooling air through the interior cavity 414 of the cage 400. As best illustrated in FIG. 5A, the front side 402 of the cage 400 may include a first set of perforations 500 disposed around the openings for the module socket regions 420, 430. The first set of perforations 500 may be configured to allow cooling air to flow into the interior cavity 414 of the cage 400 such that the cooling air travels along the lower riding heatsink 470 and into airflow passageways 480, 482, 484, 486 to cool optical modules plugged into the first and second module socket region 420, 430.

Furthermore, as best illustrated in FIG. 5B, the rear side 404 of the cage 400 may include a second set of perforations 510 that span across a majority, or the entirety, of the rear side 404 of the cage 400. Because the connector 440 is spaced from the rear side 404 of the cage 400 by the seventh airflow passageway 494, and is spaced from the sides 406, 408 by the fifth and sixth airflow passageways 490, 492, the cooling air is able to more efficiently and effectively flow around the connector 440 via the fifth and sixth airflow passageways 490, 492 and into the seventh airflow passageway 494 behind the connector 440. This increased airflow around and behind the connector 440 is then able to exit the rear side 404 of the cage 400 via any one of the second set of perforations 510 located on the rear side 404 of the cage 400. By not limiting the plurality of perforations 510 to only around the border of the rear side 404 of the cage 400, like that of the perforations 182 of the conventional optical module cage 100, the increased flow of cooling air around and behind the connector 440 is further enhanced by having an increased area through which the air is able to exit the interior cavity 414 of the cage 400. In other words, by disposing the plurality of perforations 510 across the majority, or entirety, of the rear side 404 of the cage 400, the flow of cooling air through the cage 400 is increased (e.g., flowrate, volume, etc.).

As further illustrated in FIGS. 5C and 5D, a third set of perforations 520 and a fourth set of perforations 530 are disposed on the sidewalls of the first and second sides 406, 408 of the cage 400. The third set of perforations 520 may be disposed along the length L2 of the first and second sides 406, 408 of the cage 400 at a location that is disposed before the connector 440, while the fourth set of perforations 530 may be disposed along the length L2 of the first and second sides 406, 408 of the cage 400 at a location that is disposed after the connector 440. Thus, the third set of perforations 520 disposed on the first side 406 may be aligned with the first and third airflow passageways 480, 484, while the third set of perforations 520 disposed on the second side 408 may be aligned with the second and fourth airflow passageways 482, 486. Furthermore, the fourth set of perforations 530 disposed on the first side 406 may be aligned with the fifth airflow passageway 494 and/or the seventh airflow passageway 494, while the fourth set of perforations 530 disposed on the second side 408 may be aligned with the sixth airflow passageway 492 and/or the seventh airflow passageway 494. The third set of perforations 520 and the fourth set of perforations 530 may further enhance the airflow through the interior cavity 414 of the cage 400 by allowing a portion of the cooling air to flow out of the interior cavity 414 prior to the connector 440, and a portion of the cooling air to flow out of the interior cavity 414 after passing by the connector 440, but prior to the second set of perforations 510 on the rear side 404 of the cage 400. The third and fourth sets of perforations 520, 530 provide further outlets for the cooling air to flow out of the interior cavity 414 of the cage 400, which, in addition to the second set of perforations 510, further increases the flow (e.g., flowrate, volume, etc.) of cooling air through the cage 400.

The increased width W3 of the cage 400, which creates the airflow passageways 480, 482, 484, 486, 490, 492, 494 within the interior cavity 414 of the cage 400, combined with the sets of perforations 500, 510, 520, 530 enable a greater amount of cooling air to flow through the interior cavity 414 of the cage 400 when compared to the conventional optical cage 100 illustrated in FIGS. 1A-1C. This is especially true for cooling air that is configured to cool an optical module plugged into the second module socket region 430 because the connector 440 and cage 400 dimensions do not inhibit or limit flow of cooling air across the lower riding heatsink 470 and through the interior cavity 414 of the cage 400 like that of the conventional optical module cage 100. The combination of the increased width W3 of the cage 400, the increased width W3 of the heatsinks 460, 470, the airflow passageways 480, 482, 484, 486, 490, 492, 494 within the interior cavity 414 of the cage 400, and the sets of perforations 500, 510, 520, 530 may ensure that a high flowrate of cooling air flows through the cage 400, and may ensure that QSFP-DD optical modules plugged into the cages 400 are able to be sufficiently cooled by air.

Figure 6:
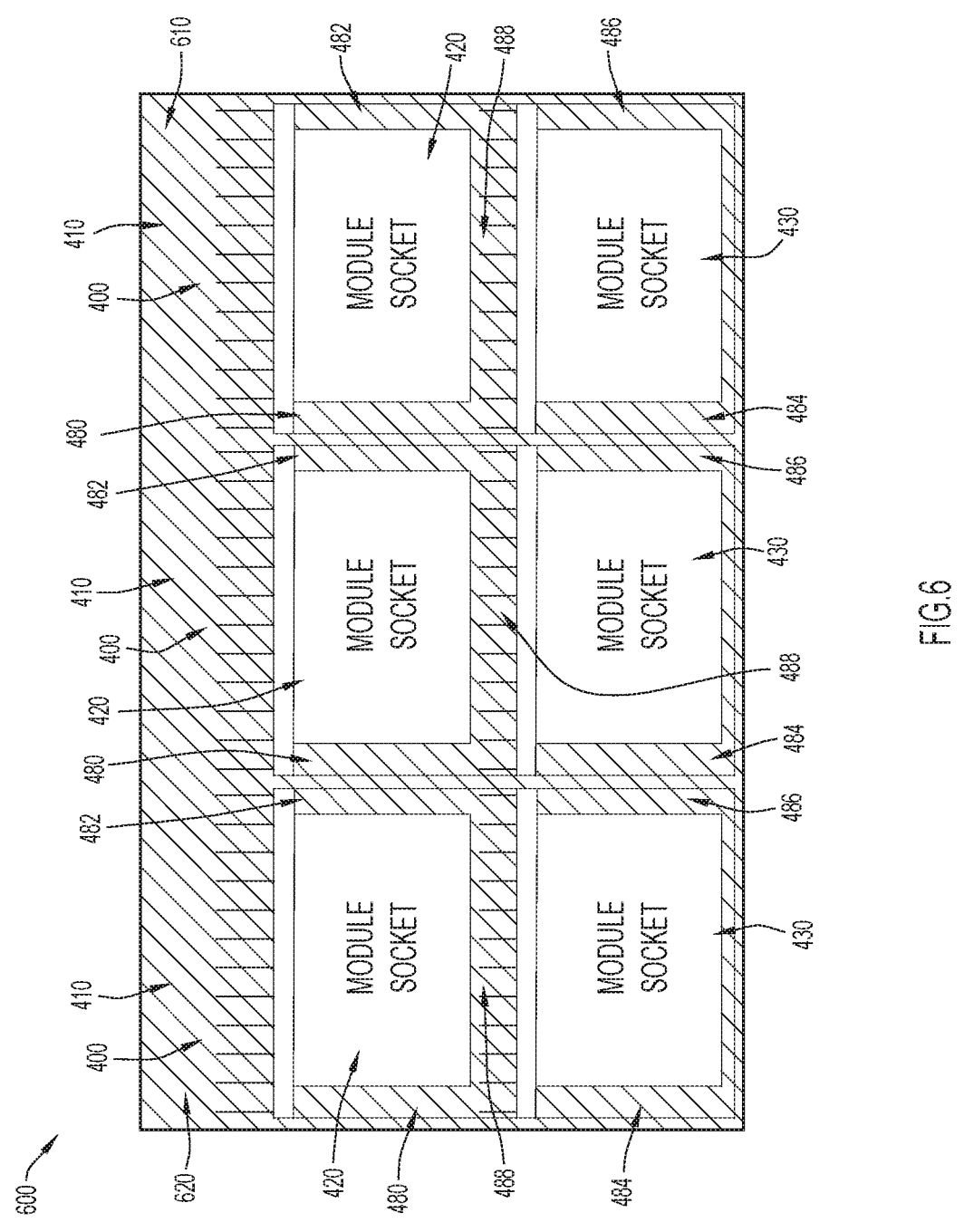

Turning to FIG. 6, and with continued reference to FIGS. 2 and 4A-4D, illustrated is an example schematic front view of a portion of a faceplate 600 with three optical module cages 400. As illustrated in FIG. 6, the cages 400 are disposed adjacent to one another, or in abutment with one another, and are not spaced from one another along the faceplate 600 by interstitial gaps like that of the conventional optical module cages 100 disposed along the faceplate illustrated in FIG. 2. Because of the passageways 480, 482, 484, 486 in the cages 400, even though the cages 400 are adjacent to, or in abutment with, one another, the distance between the module socket regions 420, 430 of one cage 400 and the module socket regions 420, 430 of another cage 400 are equivalent to the distance between the module socket regions 120, 130 of the conventional optical module cages 100. Thus, the interstitial gaps 210 between the conventional cages 100 for the faceplate 200 are occupied by the passageways 480, 482, 484, 486 in the cages 400 for the faceplate 600. In addition, the cages 400 may be equivalent or substantially equivalent in height to the conventional optical module cages 100, and thus, the faceplate 600 may have a height that is greater than the height of the cages 400 such that an upper gap 610 is disposed between the top of the faceplate 600 and the top side 410 of the cages 400.

As further illustrated in FIG. 6, the faceplate 200 may contain a series of perforations 620 that are disposed across the faceplate 600 such that the series of perforations 620 enable cooling air to pass through the faceplate 600 and enter the cages 400, where the cooling air may pass over the heatsinks 460, 470 to indirectly cool the optical modules disposed within the module socket regions 420, 430, and may pass through the airflow passageways 480, 482, 484, 486 to directly cool the optical modules disposed within the module socket regions 420, 430. Unlike the conventional optical module cages 100 and faceplate 200, where a large portion of the cooling air flows through the interstitial gaps 210, and attempts to indirectly cool optical modules plugged into the cages 100 through the sides 106, 108 of the cage 100, because the cages 400 are equipped with airflow passageways 480, 482, 484, 486, a portion of the cooling air that flows through the faceplate 600 may be in direct contact with at least a portion of the optical modules plugged into the module socket regions 420, 430.

Figure 7:
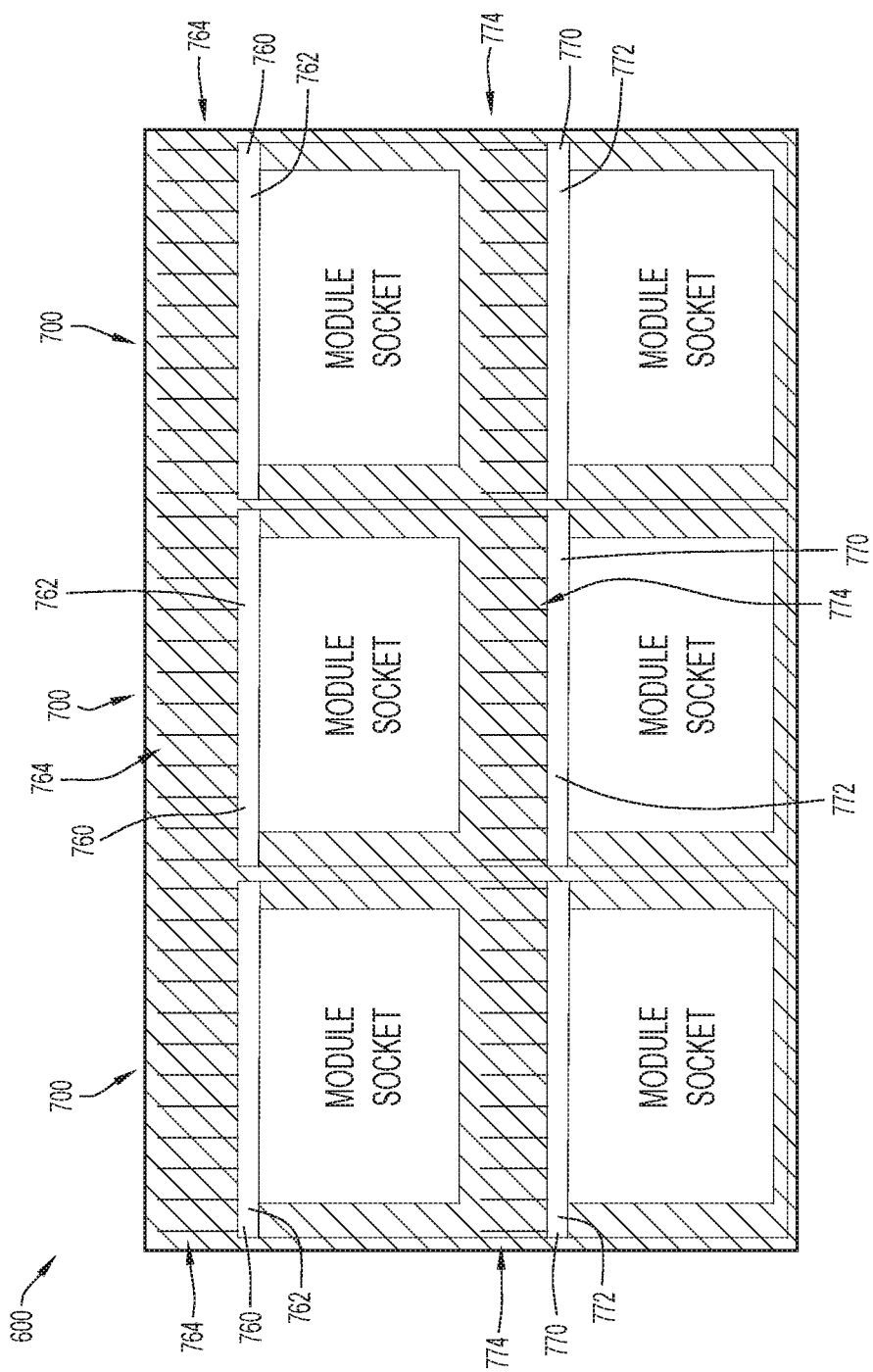
FIG. 7 illustrates a schematic diagram of a faceplate including three modified embodiments of the optical module cage illustrated in FIG. 4A, according to an example embodiment.

Turning to FIG. 7, and with continued reference to FIGS. 4A-4D and 6, illustrated is another schematic front view of a portion of a faceplate 600 with three modified optical module cages 700. More specifically, the optical module cages 700 may be substantially similar to the optical module cages 400 illustrated in FIGS. 4A-4D, but for the fins 764, 774 of the riding heatsinks 760, 770, respectively, illustrated in FIG. 7 being larger in height (i.e., the fins 764, 774 extend farther from the bases 762, 772 of the riding heatsinks 760, 770, respectively). Because the fins 774 of the riding heatsink 770 are larger than those illustrated in FIGS. 4A-4D, the spacing between the first module socket and the second module socket may be increased, which also increases the height of the central airflow passageway. Thus, the overall height of the cages 700 is increased due to the increased height of the fins 764, 774 of the riding heatsinks 760, 770 such that the cages 700 are substantially equivalent in height with the faceplate 600. When compared to the embodiment illustrated in FIG. 6, the upper gap 610 is now occupied by the fins 764 of the upper riding heatsink 760. Thus, the embodiment of the cages 700 illustrated in FIG. 7 utilizes nearly all of the cooling air that flows through the faceplate 600 to cool optical modules plugged into the cages 700.

As further illustrated in FIGS. 8A-13B, the optical module cages 400 illustrated in FIGS. 4A-4D may be further equipped with different embodiments of the heatsinks 460, 470 and/or connector 440 that may increase the effectiveness of the cooling operation performed by the heatsinks 460, 470, that may utilize the airflow through the cage 400 more efficiently, and/or that may increase the flowrate of the cooling air through the cage 400.

Illustrated in FIGS. 8A and 8B, and with continued reference to FIGS. 4A-4D, illustrated are schematic top views of the lower riding heatsink 470. More specifically, FIG. 8A illustrates an embodiment of the lower riding heatsink 470, where the fins 474 of the lower riding heatsink 470 are equipped with straight portions 800 that are disposed more proximate to the front end of the lower riding heatsink 470 (i.e., the end of the heatsink 470 that is disposed most proximate to the front side 402 of the cage 400) and angled portions 810 that are disposed more proximate to the rear end of the lower riding heatsink 470 (i.e., the end of the heatsink 470 that is disposed most proximate to the connector 440). With this embodiment of the lower riding heatsink 470, the straight portions 800 of the fins 474 direct cooling air that enters the front side 402 of the cage 400 rearward towards the connector 440. When the cooling air reaches the angled portions 810 of the fins 474, the angled portions 810 may direct the cooling air toward one of the sides 406, 408 of the cage 400 and around the connector 440. The angled portions 810 of the fins 474 of the heatsink 470 that are located more proximate to the first side 406 of the cage 400 than the second side 408 of the cage 400 may direct the cooling air to the fifth airflow passageway 490, while the angled portions 810 of the fins 474 of the heatsink 470 that are located more proximate to the second side 408 of the cage 400 than the first side 406 of the cage 400 may direct the cooling air to the sixth airflow passageway 492. Thus, the angled portions 810 of the fins 474 of the lower riding heatsink 470 more efficiently direct the cooling air around the connector 440 so that the connector 440 does not inhibit the flow of air through the cage 400. The path of cooling air around the connector 440 is shown in FIG. 8A with the arrows A.

FIG. 8B illustrates an embodiment of connector 440 where the connector 440 is split between a first portion 820 and a second portion 830 that are separated from one another via a central channel 840. The split connector 440 enables air to more easily flow into the front side 402 of the cage 400, through the interior cavity 414 of the cage 400, and out of the rear side 404 of the cage 400. As illustrated in FIG. 8B, the cooling air may flow along the fins 474 of the lower riding heatsink 470 to the connector 440, where a portion of the cooling air flows around the first portion 820 of the connector 440 into the fifth airflow passageway 490, a portion of the cooling air flows around the second portion 830 of the connector 440 into the sixth airflow passageway 492, and a portion of the cooling air flows through the central channel 840 and directly to the seventh airflow passageway 494. Thus, the connector 440 with split portions 820, 830 and a central channel 840 more effectively facilitate the flow of cooling air around the connector 440 and to the rear side 404 of the cage 400. The path of the cooling air around the connector 440 is shown in FIG. 8B with the arrows B.

It should be appreciated that the fins 474 of the lower riding heatsink 470 may be of any shape or design that facilitates the direction of cooling air around the connector 440. Moreover, it should also be appreciated that the connector 440 itself may contain any number of channels that facilitate the flow of cooling air around and through the connector 440 and to the rear side 404 of the cage 400. Furthermore, a fin design that directs the flow of cooling air over the lower riding heatsink 470 may be coupled with a split connector 440 with one or more channels to facilitate an even more efficient flow of cooling air around and through the connector 440.

Figure 9C:
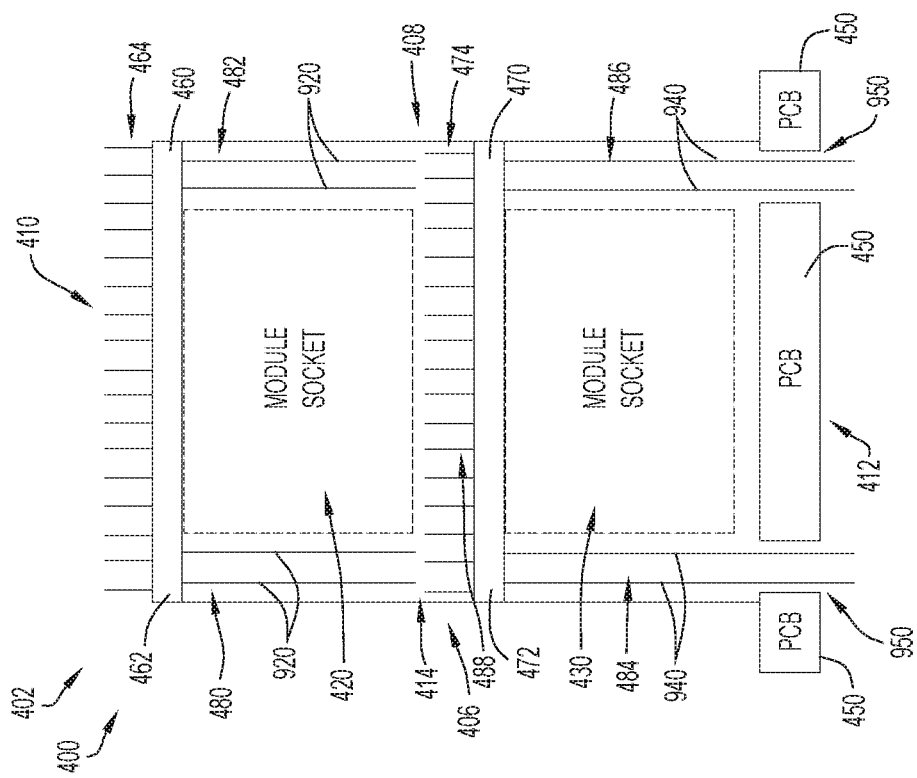

Illustrated in FIGS. 9A-9C are schematic front views of the cages 400 that are equipped with embodiments of the heatsinks 460, 470 that contain fins that extend both upwardly and downwardly from the bases 462, 472 of the heatsinks 460, 470, respectively. More specifically, as illustrated in FIG. 9A, the upper riding heatsink 460 may contain fins 464 that extend upwardly from the base 462, and a pair of fins 900 that extend downwardly from the base 462, and into the first and second airflow passageways 480, 482, respectively, such that the fins 900 are disposed between the sides 406, 408 of the cage 400 and the first module socket region 420. Similarly, the lower riding heatsink 470 may contain fins 474 that extend upwardly from the base 472 toward the upper riding heatsink 460, and a pair of fins 910 that extend downwardly from the base 472, and into the third and fourth airflow passageways 484, 486, respectively, such that the fins 910 are disposed between the sides 406, 408 of the cage 400 and the second module socket region 430. The placement of the fins 900, 910 into the airflow passageways 480, 482, 484, 486 enables the heatsinks 460, 470 to dissipate more heat away from the optical modules plugged into the module socket regions 420, 430.

As further illustrated in FIG. 9B, the upper riding heatsink 460 may be further equipped with an increased number of fins 920 that descend from the base 462 into the first and second airflow passageways 480, 482, while the lower riding heatsink 470 may also be equipped with an increased number of fins 930 that descend from the base 472 into the third and fourth airflow passageways 484, 486. By increasing the number of fins within the airflow passageways 480, 482, 484, 486, the amount of heat that may be dissipated by the heatsinks 460, 470 is also increased.

In addition, FIG. 9C illustrates another embodiment of a cage 400 equipped with an upper riding heatsink 460 that contains multiple fins 920 that descend from the base 462 into the first and second airflow passageways 480, 482, like that illustrated in FIG. 9B, but the lower riding heatsink 470 may contain multiple fins 940 that descend from the base 472 through the third and fourth airflow passageways 484, 486, and through channels 950 in the PCB 450. Thus, the fins 940 of the lower riding heatsink 470 may be subjected to both a flow of cooling air within the cage 400 and a flow of cooling air below the PCB 450 and the cage 400 in order to dissipate more heat from an optical module plugged into the second module socket region 430.

Figure 10B:
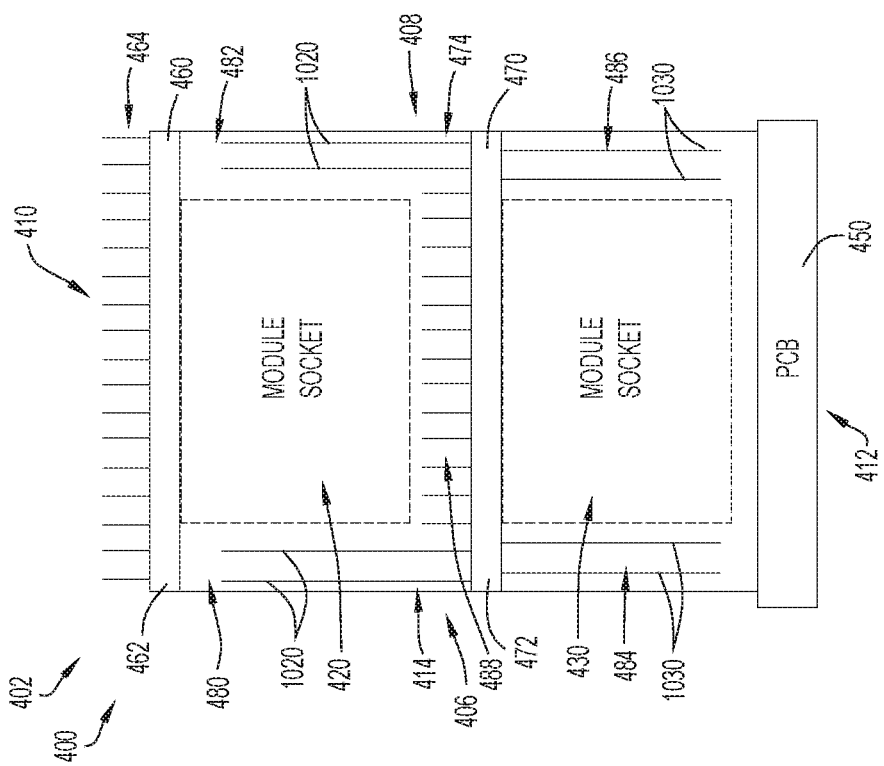
Figure 10A:
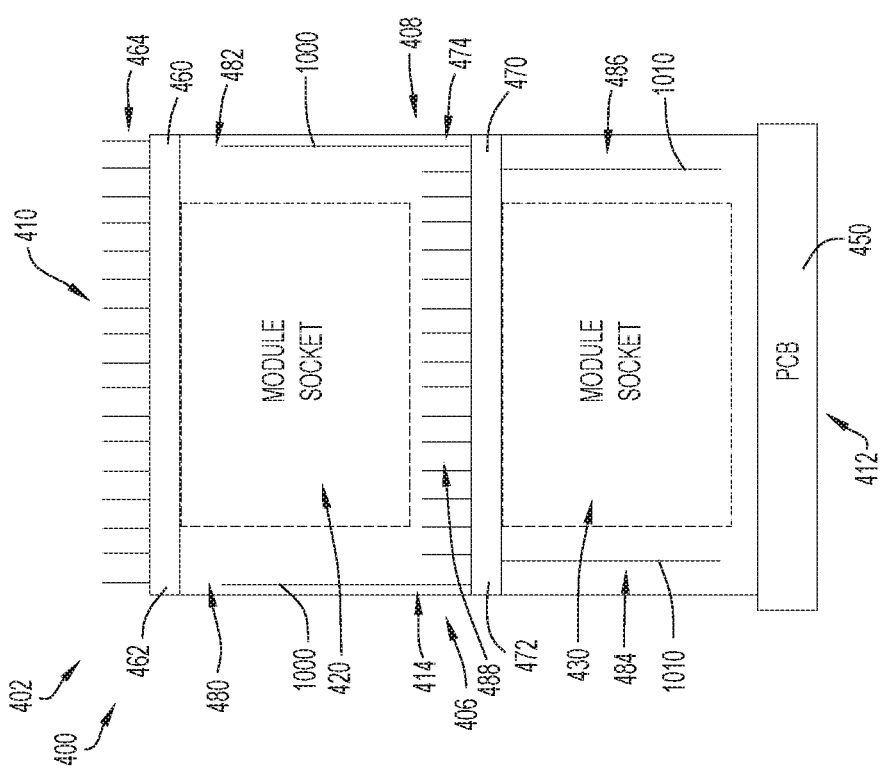

Illustrated in FIGS. 10A-10C are schematic front views of the cages 400 that are equipped with embodiments of the lower riding heatsink 470 that have a substantially H-shaped cross-section. As illustrated in FIG. 10A, the lower riding heatsink 470 may contain a first set of fins 474 that ascend or extend upwardly from the top of the base 472, a second set of outermost ascending fins 1000 that ascend or extend upwardly from the top of the base 472 and are taller in height than the first set of fins 474, and a third set of descending fins 1010 that extend downwardly or descend from the base 472. In addition, the outermost ascending fins 1000 are disposed more proximate to the first and second sides 406, 408 of the cage 400 than the first set of fins 474, and are configured to extend upwardly into the first and second airflow passageways 480, 482 such that the outermost ascending fins 1000 are disposed between the sides 406, 408 of the cage 400 and the first module socket region 420. The descending fins 1010 may extend downwardly from the base 472 and into the third and fourth airflow passageways 484, 486 such that the descending fins 1010 are disposed between the sides 406, 408 of the cage 400 and the second module socket region 430. Thus, as illustrated, the lower riding heatsink 470 utilizes cooling air passing through airflow passageways 480, 482, 484, 486 (i.e., via the outermost ascending fins 1000 and the descending fins 1010) and cooling air passing through the area between the module socket regions 420, 430 (i.e., via the fins 474) to dissipate heat from an optical module plugged into the second module socket region 420. The upper riding heatsink 460 primarily utilizes cooling air passing over the top side 410 of the cage 400 (i.e., via the fins 464) to dissipate heat from an optical module plugged into the first module socket region 420.

As further illustrated in FIG. 10B, the lower riding heatsink 470 may be equipped with multiple outermost ascending fins 1020 that extend upwardly from the base 472 into the first and second airflow passageways 480, 482, and multiple descending fins 1030 that descend from the base 472 into the third and fourth airflow passageways 484, 486. By increasing the number of fins 1020, 1030 disposed within the airflow passageways 480, 482, 484, 486, the amount of heat that may be dissipated by the lower riding heatsink 470 is increased.

In addition, FIG. 10C illustrates another embodiment of a cage 400 equipped with a lower riding heatsink 470 that contains multiple outermost ascending fins 1020 that extend upwardly from the base 472 into the first and second airflow passageways 480, 482, like that illustrated in FIG. 10B, but that also contains multiple descending fins 1040 that descend from the base 472 through the third and fourth airflow passageways 484, 486, and through channels 1050 in the PCB 450. Thus, the descending fins 1040 of the lower riding heatsink 470 may be subjected to both a flow of cooling air within the cage 400 and a flow of cooling air below the PCB 450 and the cage 400 in order to dissipate more heat from an optical module plugged into the second module socket region 430.

Illustrated in FIGS. 11A, 11B, 12A, and 12B are schematic front views of the cages 400 that are equipped with embodiments of the riding heatsinks 460, 470 that have a substantially U-shaped cross-section. As illustrated in FIG. 11A, the upper riding heatsink 460 includes a horizontal base 462 and two descending base portions 1100, 1110 that descend from the horizontal base 462 on opposing sides of the first module socket region 420. The first descending base portion 1100 extends downwardly from the horizontal base 462 through the first airflow passageway 480 and along a first side of the first module socket region 420, while the second descending base portion 1110 extends downwardly from the horizontal base 462 through the second airflow passageway 482 and along a second side of the first module socket region 420. Thus, the base 462 and descending base portions 1100, 1110 give the upper riding heatsink 460 a substantially inverted U-shape around the first module socket region 420. An optical module disposed within or plugged into the first module socket region 420 may be in abutment with the horizontal base 462 and the two descending base portions 1100, 1110 of the upper riding heatsink 460. As further illustrated in FIG. 11A, a set of ascending fins 464 extend upwardly from the horizontal base 462, while a first set of horizontal fins 1102 extend from the first descending base portion 1100 toward the first side 406 of the cage 400, and while a second set of horizontal fins 1112 extend from the second descending base portion 1110 toward the second side 408 of the cage 400.

Continuing with FIG. 11A, the lower riding heatsink 470 may be substantially similar to the upper riding heatsink 460. As illustrated, the lower riding heatsink 470 also includes a horizontal base 472 and two descending base portions 1120, 1130 that descend from the horizontal base 472 on opposing sides of the second module socket region 430. The first descending base portion 1120 extends downwardly from the horizontal base 472 through the third airflow passageway 484 and along a first side of the second module socket region 430, while the second descending base portion 1130 extends downwardly from the horizontal base 472 through the fourth airflow passageway 486 and along a second side of the second module socket region 430. Thus, the base 472 and descending base portions 1120, 1130 give the lower riding heatsink 470 a substantially inverted U-shape around the second module socket region 430. An optical module disposed within or plugged into the second module socket region 430 may be in abutment with the horizontal base 472 and the two descending base portions 1120, 1130 of the lower riding heatsink 470. As further illustrated in FIG. 11A, a set of ascending fins 474 extend upwardly from the horizontal base 472 toward the first module socket region 420, while a first set of horizontal fins 1122 extend from the first descending base portion 1120 toward the first side 406 of the cage 400, and while a second set of horizontal fins 1132 extend from the second descending base portion 1130 toward the second side 408 of the cage 400.

In addition, FIG. 11B illustrates another embodiment of a cage 400 equipped with riding heatsinks 460, 470 that have a substantially inverted U-shape like that illustrated in FIG. 11A. While the upper riding heatsink 460 illustrated in FIG. 11B is substantially similar to the upper riding heatsink 460 illustrated in FIG. 11A, where the upper riding heatsink 460 contains the horizontal base 462 and two descending base portions 1100, 1110, the lower riding heatsink 470 illustrated in FIG. 11B differs from the lower riding heatsink 470 illustrated in FIG. 11A. More specifically, the lower riding heatsink 470 illustrated in FIG. 11B may contain a horizontal base 472 and two descending base portions 1140, 1150 that descend from the horizontal base 472 on opposing sides of the second module socket region 430, through the third and fourth airflow passageways 484, 486, respectively, and through channels 1160 in the PCB 450. The first descending base portion 1140 may contain a first set of horizontal fins 1142, which are disposed within the third airflow passageway 484, and which extend toward the first side 406 of the cage 400, and a second set of horizontal fins 1144 that are disposed below the PCB 450 and the bottom 412 of the cage 400. The second set of horizontal fins 1144 may further include fins that extend both toward the first side 406 of the cage 400 and toward the second side 408 of the cage 400. Similarly, the second descending base portion 1150 may contain a first set of horizontal fins 1152, which are disposed within the fourth airflow passageway 486, and which extend toward the first side 408 of the cage 400, and a second set of horizontal fins 1154 that are disposed below the PCB 450 and the bottom 412 of the cage 400. The second set of horizontal fins 1154 may further include fins that extend both toward the first side 406 of the cage 400 and toward the second side 408 of the cage 400. The two descending base portions 1140, 1150 of the lower riding heatsink 470, and their associated horizontal fins 1142, 1144, 1152, 1154, may be subjected to both a flow of cooling air within the cage 400 and a flow of cooling air below the PCB 450 and the cage 400 in order to dissipate more heat from an optical module plugged into the second module socket region 430.

The substantially U-shaped heatsinks 460, 470 illustrated in FIGS. 11A and 11B are configured to have a larger surface area that is in abutment with an optical module plugged into the module socket regions 420, 430, which enables the heatsinks 460, 470 to pull a larger amount of heat away from the optical modules, while also having a larger surface area (i.e., through the addition of the descending base portions 1100, 1110, 1120, 1130, 1140, 1150 and their associated horizontal fins 1102, 1112, 1122, 1132, 1142, 1144, 1152, 1154) in contact with a flow of cooling air in order to dissipate the heat pulled from the optical modules plugged into the module socket regions 420, 430.

Turning to FIG. 12A, and with continued reference to FIG. 11A, illustrated is another embodiment of the cage 400 where the riding heatsinks 460, 470 have a substantially inverted U-shape. Like that illustrated in FIG. 11A, the upper riding heatsink 460 illustrated in FIG. 12A includes a horizontal base 462 and two descending base portions 1200, 1210 that descend from the horizontal base 462 on opposing sides of the first module socket region 420. The first descending base portion 1200 extends downwardly from the horizontal base 462 through the first airflow passageway 480, while the second descending base portion 1210 extends downwardly from the horizontal base 462 through the second airflow passageway 482. Thus, the base 462 and descending base portions 1200, 1210 give the upper riding heatsink 460 a substantially inverted U-shape around the first module socket region 420. However, unlike the U-shaped upper riding heatsink 460 illustrated in FIG. 11A, the descending base portions 1200, 1210 of the upper riding heatsink 460 illustrated in FIG. 12A are spaced from the sides of the first module socket region 420 such that an optical module disposed within, or plugged into, the first module socket region 420 may only be in abutment with the horizontal base 462 of the upper riding heatsink 460. As further illustrated in FIG. 12A, a set of ascending fins 464 extend upwardly from the horizontal base 462, while a first set of horizontal fins 1202 extend from both sides of the first descending base portion 1200 (i.e., fins extend horizontally toward both the first and second sides 406, 408 of the cage 400), and while a second set of horizontal fins 1212 extend from both sides of the second descending base portion 1210 (i.e., fins extend horizontally toward both the first and second sides 406, 408 of the cage 400).

Continuing with FIG. 12A, the lower riding heatsink 470 may be substantially similar to the upper riding heatsink 460 illustrated in FIG. 12A. As illustrated, the lower riding heatsink 470 also includes a horizontal base 472 and two descending base portions 1220, 1230 that descend from the horizontal base 472 on opposing sides of the second module socket region 430. The first descending base portion 1220 extends downwardly from the horizontal base 472 through the third airflow passageway 484, while the second descending base portion 1230 extends downwardly from the horizontal base 472 through the fourth airflow passageway 486. Thus, the base 472 and descending base portions 1220, 1230 give the lower riding heatsink 470 a substantially inverted U-shape around the second module socket region 430. Unlike the U-shaped lower riding heatsink 470 illustrated in FIG. 11A, the descending base portions 1220, 1230 of the lower riding heatsink 470 illustrated in FIG. 12A are spaced from the sides of the second module socket region 430 such that an optical module disposed within, or plugged into, the second module socket region 430 may be in abutment with only the horizontal base 472. As further illustrated in FIG. 12A, a set of ascending fins 474 extend upwardly from the horizontal base 472 toward the first module socket region 420, while a first set of horizontal fins 1222 extend from both sides of the first descending base portion 1220 (i.e., fins extend horizontally toward both the first and second sides 406, 408 of the cage 400), and while a second set of horizontal fins 1232 extend from both sides of the second descending base portion 1230 (i.e., fins extend horizontally toward both the first and second sides 406, 408 of the cage 400).

In addition, FIG. 12B illustrates another embodiment of a cage 400 equipped with riding heatsinks 460, 470 that have a substantially inverted U-shape like that illustrated in FIG. 12A. While the upper riding heatsink 460 illustrated in FIG. 12B is substantially similar to the upper riding heatsink 460 illustrated in FIG. 12A, where the upper riding heatsink 460 contains the horizontal base 462 and two descending base portion 1200, 1210, the lower riding heatsink 470 illustrated in FIG. 12B may differ from the lower riding heatsink 470 illustrated in FIG. 12A. More specifically, the lower riding heatsink 470 illustrated in FIG. 12B may contain a horizontal base 472 and two descending base portions 1240, 1250 that descend from the horizontal base 472 through the third and fourth airflow passageways 484, 486, respectively, and through channels 1260 in the PCB 450. The first descending base portion 1240 may contain a first set of horizontal fins 1242 that extend from both sides of the first descending base portion 1240 within the third airflow passageway 484, and a second set of horizontal fins 1244 that are disposed below the PCB 450 and the bottom 412 of the cage 400, and that extend from both sides of the first descending base portion 1240. Similarly, the second descending base portion 1250 may contain a first set of horizontal fins 1252 that extend from both sides of the second descending base portion 1250 within the fourth airflow passageway 486, and a second set of horizontal fins 1254 that are disposed below the PCB 450 and the bottom 412 of the cage 400, and that extend from both sides of the second descending base portion 1250. The two descending base portions 1240, 1250 of the lower riding heatsink 470, and their associated horizontal fins 1242, 1244, 1252, 1254, may be subjected to both a flow of cooling air within the cage 400 and a flow of cooling air below the PCB 450 and the cage 400 in order to dissipate more heat from an optical module plugged into the second module socket region 430.

The substantially U-shaped heatsinks 460, 470 illustrated in FIGS. 12A, 12B are configured to have a larger surface area (i.e., through the addition of the descending base portions 1200, 1210, 1220, 1230, 1240, 1250 and their associated horizontal fins 1202, 1212, 1222, 1232, 1242, 1244, 1252, 1254) in contact with a flow of cooling air in order to more quickly and efficiently dissipate the heat pulled from the optical modules plugged into the module socket regions 420, 430.

Illustrated in FIGS. 13A and 13B are schematic front views of the cages 400 that are equipped with a group or a cluster of multiple heatsinks that are disposed around each one of the module socket regions 420, 430. As illustrated in FIG. 13A, disposed around the first module socket region 420 is a first cluster of riding heatsinks 1300, while a second cluster of riding heatsinks 1310 are disposed around the second module socket region 430. The first cluster of riding heatsinks 1300 includes the upper riding heatsink 460 disposed atop the first module socket region 420, a first descending riding heatsink 1320 extending along a first side of the first module socket region 420, and a second descending riding heatsink 1330 extending along a second side of the first module socket region 420. The upper riding heatsink 460 may include the horizontal base 462 that spans from the first side 406 to the second side 408 of the cage 400, and may include a set of upwardly extending fins 464. The first descending riding heatsink 1320 may be disposed within the first airflow passageway 480, and may include a base 1322 that is disposed along a first side of the first module socket region 420, and a set of fins 1324 that extend horizontally from the base 1322 toward the first side 406 of the cage 400. Conversely, the second descending riding heatsink 1330 may be disposed within the second airflow passageway 482, and may include a base 1332 that is disposed along a second side of the first module socket region 420, and a set of fins 1334 that extend horizontally from the base 1332 toward the second side 408 of the cage 400. An optical module disposed within or plugged into the first module socket region 420 may be in abutment with each of the bases 462, 1322, 1332 of the riding heatsinks 460, 1320, 1330, respectively, of the first cluster of riding heatsinks 1300.

Continuing with FIG. 13A, the second cluster of riding heatsinks 1310 may be substantially similar to first cluster of riding heatsinks 1300. As illustrated, the second cluster of riding heatsinks 1310 includes the lower riding heatsink 470 disposed atop the second module socket region 430, a first descending riding heatsink 1340 extending along a first side of the second module socket region 430, and a second descending riding heatsink 1350 extending along a second side of the second module socket region 430. The lower riding heatsink 470 may include the horizontal base 472 that spans from the first side 406 to the second side 408 of the cage 400, and may include a set of upwardly extending fins 474 that extend upwardly toward the first module socket region 420. The first descending riding heatsink 1340 may be disposed within the third airflow passageway 484, and may include a base 1342 that is disposed along a first side of the second module socket region 430, and a set of fins 1344 that extend horizontally from the base 1342 toward the first side 406 of the cage 400. Conversely, the second descending riding heatsink 1350 may be disposed within the fourth airflow passageway 486, and may include a base 1352 that is disposed along a second side of the second module socket region 430, and a set of fins 1354 that extend horizontally from the base 1352 toward the second side 408 of the cage 400. An optical module disposed within or plugged into the second module socket region 430 may be in abutment with each of the bases 472, 1342, 1352 of the riding heatsinks 470, 1340, 1350, respectively, of the second cluster of riding heatsinks 1310.

In addition, FIG. 13B illustrates another embodiment of a cage 400 equipped with a group or a cluster of multiple heatsinks that are disposed around each one of the module socket regions 420, 430. While the first cluster of riding heatsinks 1300 illustrated in FIG. 13B are substantially similar to the first cluster of riding heatsink 1300 illustrated in FIG. 13A, the second cluster of riding heatsinks 1310 illustrated in FIG. 13B may differ from the second cluster of riding heatsinks 1310 illustrated in FIG. 13A. More specifically, the second cluster of riding heatsinks 1310 illustrated in FIG. 13B may include the lower riding heatsink 470 disposed atop the second module socket region 430, a first descending riding heatsink 1360 that extends along a first side of the second module socket region 430, and a second descending riding heatsink 1370 extending along a second side of the second module socket region 430. The first and second descending riding heatsinks 1360, 1370 may extend along on opposing sides of the second module socket region 430, through the third and fourth airflow passageways 484, 486, respectively, and through channels 1380 in the PCB 450. Thus, the first descending riding heatsink 1360 may be disposed primarily within the third airflow passageway 484, and may include a base 1362 that is disposed along a first side of the second module socket region 430 and that at least partially extends through the channel 1380 in the PCB 450. The first descending riding heatsink 1360 may further include a first set of fins 1364 that extend horizontally from the base 1362 within the third airflow passageway 484 toward the first side 406 of the cage 400, and a second set of fins 1366 that extend from both sides of the base 1362 below the PCB 450 and the bottom 412 of the cage 400 (i.e., the second set of fins 1366 include fins that extend toward the first side 406 of the cage 400 and fins that extend toward the second side 408 of the cage 400). Conversely, the second descending riding heatsink 1370 may be disposed primarily within the fourth airflow passageway 486, and may include a base 1372 that is disposed along a second side of the second module socket region 430 and that at least partially extends through the channel 1380 in the PCB 450. The second descending riding heatsink 1370 may further include a first set of fins 1374 that extend horizontally from the base 1372 within the fourth airflow passageway 484 toward the second side 408 of the cage 400, and a second set of fins 1376 that extend from both sides of the base 1372 below the PCB 450 and the bottom 412 of the cage 400 (i.e., the second set of fins 1376 include fins that extend toward the first side 406 of the cage 400 and fins that extend toward the second side 408 of the cage 400). The two descending riding heatsinks 1360, 1370 of the second cluster of riding heatsinks 1310, and their associated horizontal fins 1364, 1366, 1374, 1376, may be subjected to both a flow of cooling air within the cage 400 and a flow of cooling air below the PCB 450 and the cage 400 in order to dissipate more heat from an optical module plugged into the second module socket region 430.

Figure 14:
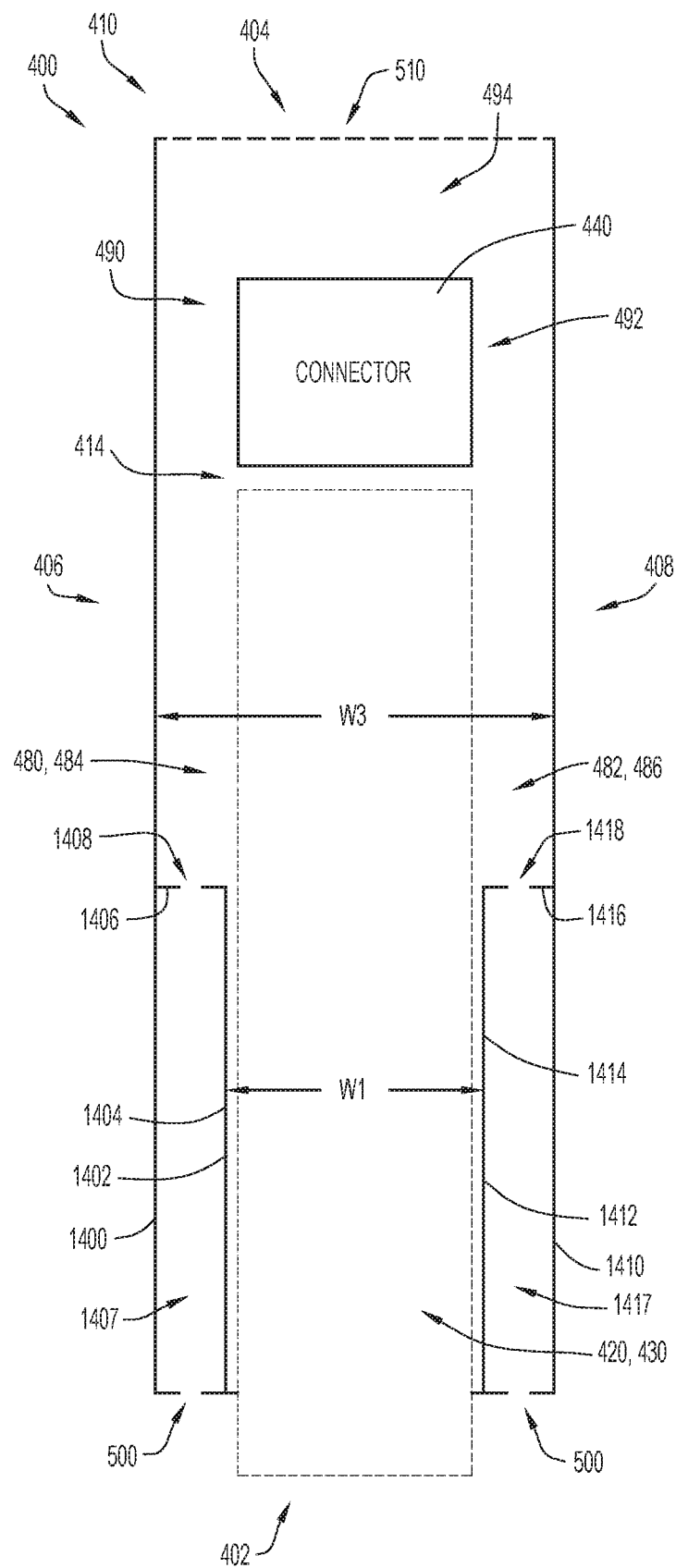
FIGS. 14 and 15 illustrate schematic top views of optical module cages having a substantially T-shape cross-section, according to another example embodiment.
Figure 15:
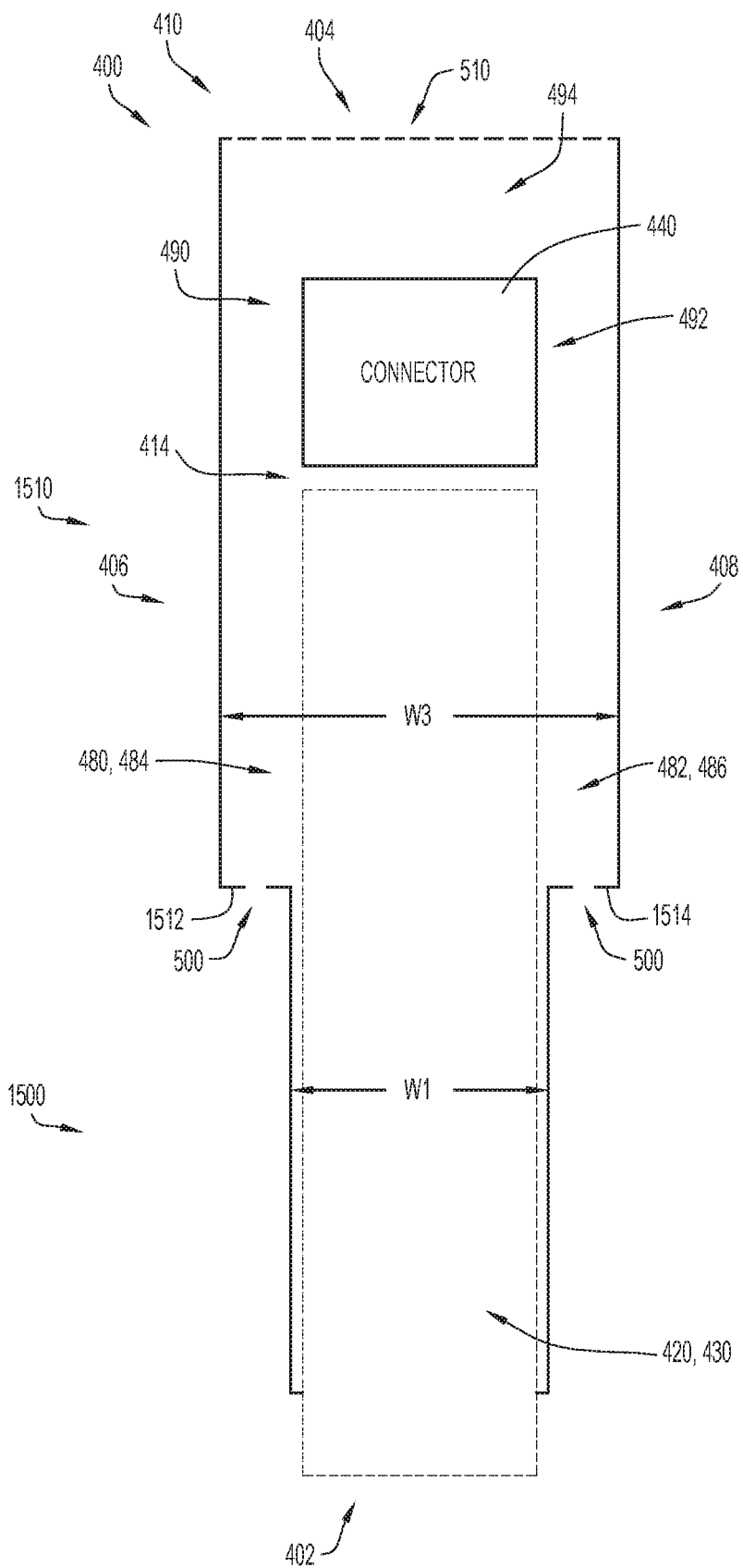
Figure 16:
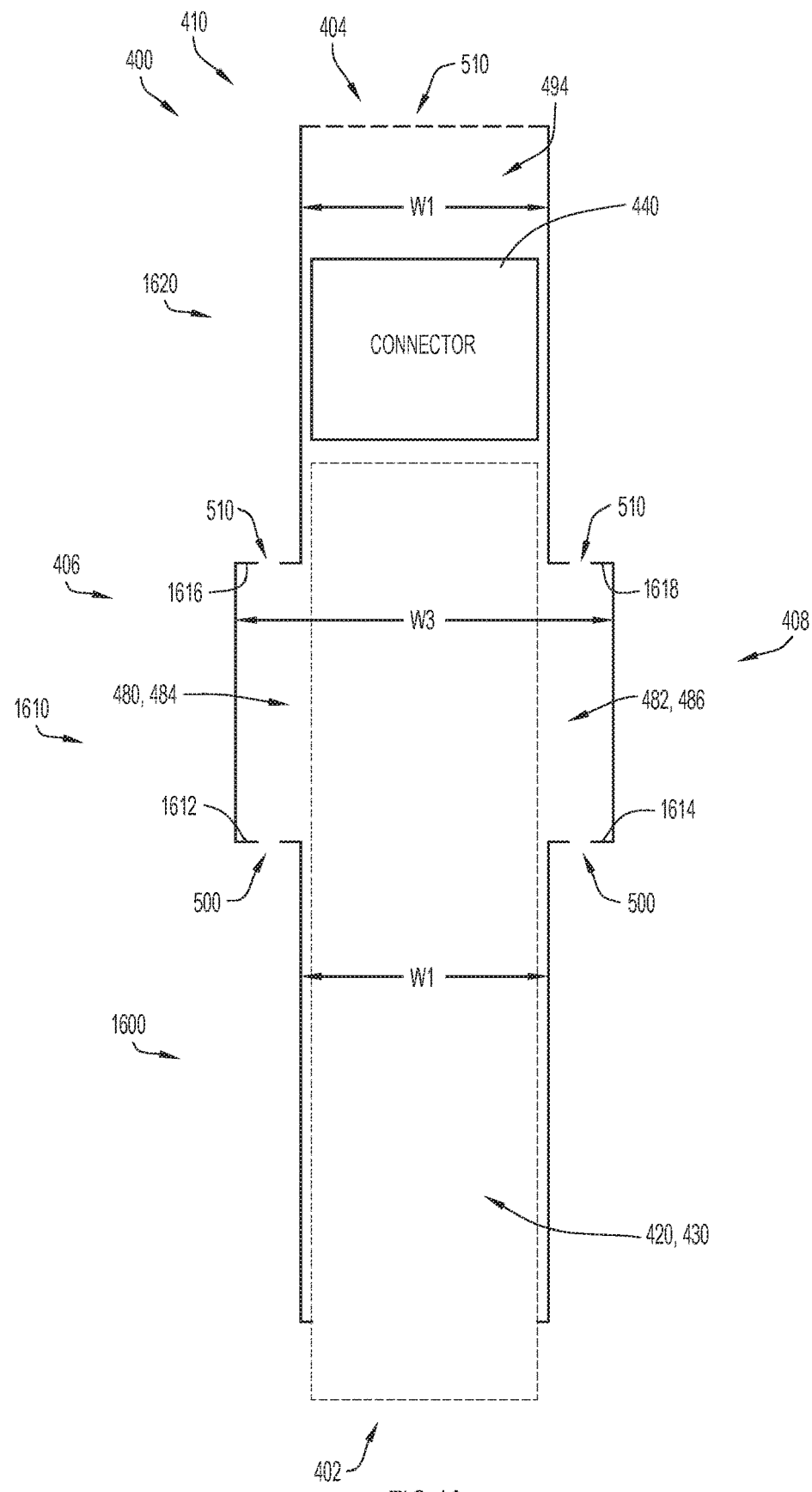
FIG. 16 illustrates a schematic top view of an optical module cage having a substantially cross shaped cross-section, according to another example embodiment.

As further illustrated in FIGS. 14-16, the optical module cages 400 illustrated in FIGS. 4A-4D may be further optimized to maximize airflow through the cages 400, while providing increased structural integrity to the cages 400.

Illustrated in FIG. 14, and with continued reference to FIGS. 4A-5D, is a schematic top view of an optical module cage 400 equipped with inner guide channels 1400, 1410. The first inner guide channel 1400 may be disposed proximate to the front side 402 and the first side 406 of the cage 400, while the second inner guide channel 1410 may be disposed proximate to the front side 402 and the second side 408 of the cage 400. As illustrated in FIG. 14, the first inner guide channel 1400 may be disposed within at least a portion of both the first and third airflow passageways 480, 484. The first inner guide channel 1400 may include a wall or barrier 1402 that has a first portion 1404 and a second portion 1406. The first portion 1404 of the barrier 1402 extends longitudinally through the interior cavity 414 from the front side 402 of the cage 400, while the second portion 1406 of the barrier 1402 extends laterally through the interior cavity 414 between the first portion 1404 of the barrier 1402 and the first side 406 of the cage 400. The portions 1404, 1406 of the barrier 1402 collectively define, with the front side 402 and the first side 406 of the cage 400, an interior region 1407 of the first inner guide channel 1400. A portion of the first set of perforations 500 disposed on the front side 402 of the cage 400 may enable cooling air to flow into the interior region 1407 of the first inner guide channel 1400 through the front side 402 of the cage 400. A rearward set of perforations 1408 may be disposed on the second portion 1406 of the barrier 1402 that enable cooling air to flow out of the interior region 1407 of the first inner guide channel 1400, and through the remainder of the first and third airflow passageways 480, 484.

The second inner guide channel 1410 may be substantially similar to the first inner guide channel 1400, as the second inner guide channel 1410 may be a mirror image of the first inner guide channel 1400. As illustrated in FIG. 14, the second inner guide channel 1410 may be disposed within at least a portion of both the second and fourth airflow passageways 482, 486. The second inner guide channel 1410 may include a wall or barrier 1412 that has a first portion 1414 and a second portion 1416. The first portion 1414 of the barrier 1412 extends longitudinally through the interior cavity 414 from the front side 402 of the cage 400, while the second portion 1416 of the barrier 1412 extends laterally through the interior cavity 414 between the first portion 1414 of the barrier 1412 and the second side 408 of the cage 400. The portions 1414, 1416 of the barrier 1412 collectively define, with the front side 402 and the second side 408 of the cage 400, an interior region 1417 of the second inner guide channel 1410. A portion of the first set of perforations 500 disposed on the front side 402 of the cage 400 may enable cooling air to flow into the interior region 1417 of the second inner guide channel 1410 through the front side 402 of the cage 400. A rearward set of perforations 1418 may be disposed on the second portion 1416 of the barrier 1412 that enable cooling air to flow out of the interior region 1417 of the second inner guide channel 1410, and through the remainder of the second and fourth airflow passageways 482, 486.

As further illustrated in FIG. 14, the first and second inner guide channels 1400, 1410 may be dimensioned such that the barrier 1402 of first inner guide channel 1400 is spaced from the barrier 1412 of the second inner guide channel 1410 by a width W1, which is substantially equivalent to the width of the module socket regions 420, 430 and the width of the optical modules that may be plugged into the module socket regions 420, 430. While not illustrated, any riding heatsinks 460, 470 disposed within the cage 400 illustrated in FIG. 14 may be substantially T-shaped, with a thinner width portion that is disposed between the inner guide channels 1400, 1410, and a wider width portion that is disposed rearward from the inner guide channels 1400, 1410. Thus, the inner guide channels 1400, 1410 serve to guide the optical modules into and through the module socket regions 420, 430, while still enabling the additional air cooling functionality of the airflow passageways 480, 482, 484, 486, and while still allowing for a portion of the riding heatsinks to have an increased width.

Illustrated in FIG. 15, and with continued reference to FIGS. 4A-5D, is a schematic top view of an optical module cage 400 having multiple portions of differing widths such that the cage 400 has a top view cross-section with a substantially T-shape. The cage 400 illustrated in FIG. 15 may have a first or front portion 1500 and a second or rear portion 1510. As illustrated, in the front portion 1500, the first side 406 of the cage 400 may be spaced from the second side 408 of the cage 400 by a width W1, which is substantially equivalent to the width of the module socket regions 420, 430 and the width of the optical modules that may be plugged into the module socket regions 420, 430. Furthermore, in the rear portion 1510 of the cage 400, the first side 406 of the cage 400 may be spaced from the second side 408 of the cage 400 by a wider width W3, which is equivalent to the width W3 of the cage 400 illustrated in FIGS. 4A-4D. The front portion 1500 may be oriented along approximately the first half of the length of the cage 400, while the rear portion 1510 may be oriented along approximately the second half of the length of the cage 400. However, the front and rear portions 1500, 1510 may extend or be oriented along any amount of the length of the cage 400 (e.g., the front portion 1500 may extend along approximately 75% of the length of the cage 400, while the rear portion 1510 may extend along approximately 25% of the length of the cage 400; the front portion 1500 may extend along approximately 25% of the length of the cage 400, while the rear portion 1510 may extend along approximately 75% of the length of the cage 400; etc.).

Because the rear portion 1510 is wider than the front portion 1500, the rear portion 1510 may be equipped with a first front face 1512 disposed proximate to the first side 406 of the cage 400, and a second front face 1514 disposed proximate to the second side 408 of the cage 400. In the embodiment of the cage 400 illustrated in FIG. 15, the first and third airflow passageways 480, 484 may extend rearward from the first front face 1512 to the fifth airflow passageway 490, while the second and fourth airflow passageways 482, 486 may extend rearward from the second front face 1514 to the sixth airflow passageway 492. A portion of the first set of perforations 500 may be disposed on the first front face 1512 and the second front face 1514 so that cooling air may enter the interior cavity 414 of the cage 400 and may travel through the airflow passageways 480, 482, 484, 486.

While not illustrated, any riding heatsinks 460, 470 disposed within the cage 400 illustrated in FIG. 15 may be substantially T-shaped, with a thinner width portion that is disposed in the front portion 1500 of the cage 400, and a wider width portion that is disposed in the rear portion 1510 of the cage 400. Thus, because of the thinner width of the front portion 1500, the front portion 1500 serves to guide the optical modules into and through the module socket regions 420, 430. Furthermore, because of the wider width of the rear portion 1510, the rear portion 1510 enables the use of the airflow passageways 480, 482, 484, 486 and allows for a portion of the riding heatsinks to have an increased width (i.e., an increased heat dissipating surface area). The perforations 500 disposed on the front faces 1512, 1514 allow for additional cooling air to flow into the airflow passageways 480, 482, 484, 486.

Illustrated in FIG. 16, and with continued reference to FIGS. 4A-5D, is a schematic top view of an optical module cage 400 having multiple portions of differing widths such that the cage 400 has a top view cross-section with a substantially cross shape. The cage 400 illustrated in FIG. 16 may have a first or front portion 1600, a second or intermediate portion 1610, and a third or rear portion 1620. As illustrated, in the front portion 1600, the first side 406 of the cage 400 may be spaced from the second side 408 of the cage 400 by a width W1, which is substantially equivalent to the width of the module socket regions 420, 430 and the width of the optical modules that may be plugged into the module socket regions 420, 430. Furthermore, in the intermediate portion 1610, the first side 406 of the cage 400 may be spaced from the second side 408 of the cage 400 by the wider width W3, which is equivalent to the width W3 of the cage 400 illustrated in FIGS. 4A-4D. In the rear portion 1620, the first side 406 of the cage 400 may also be spaced from the second side 408 of the cage 400 by the width W1. As illustrated, the front portion 1600 may be disposed proximate to the front side 402 of the cage 400, the rear portion 1620 may be disposed proximate to the rear side 404 of the cage 400, and the wider intermediate portion 1610 may be disposed intermediate the front and rear portions 1600, 1620. Thus, the rear portion 1620 may be disposed proximate to the connector 440 of the cage 400.

Because the intermediate portion 1610 is wider than the front and rear portions 1600, 1620, and because the intermediate portion is disposed between the front and rear portions 1600, 1620, the intermediate portion 1610 may be equipped with front faces 1612, 1614, and rear faces 1616, 1618. The first front face 1612 and the first rear face 1616 may be disposed proximate to the first side 406 of the cage 400, while the second front face 1614 and the second rear face 1618 may be disposed proximate to the second side 408 of the cage 400. In the embodiment of the cage 400 illustrated in FIG. 16, the first and third airflow passageways 480, 484 may extend along the intermediate portion 1610 between the first front face 1612 and the first rear face 1616, while the second and fourth airflow passageways 482, 486 may extend along the intermediate portion 1610 between the second front face 1614 and the second rear face 1618. A portion of the first set of perforations 500 may be disposed on the first and second front faces 1612, 1614, while a portion of the second set of perforations 510 may be disposed on the first and second rear faces 1616, 1618 so that cooling air may enter the interior cavity 414 of the cage 400 and travel through the airflow passageways 480, 482, 484, 486. Because of the location of the rear portion 1620 and because of the thinner width of the rear portion 1620, the embodiment of the cage 400 illustrated in FIG. 16 does not contain the fifth and sixth airflow passageways 490, 492 around the connector 440.

While not illustrated, any riding heatsinks 460, 470 disposed within the cage 400 illustrated in FIG. 16 may also be substantially cross shaped, with thinner width portions that are disposed in the front and rear portions 1600, 1620 of the cage 400, and a wider width portion that is disposed in the intermediate portion 1610 of the cage 400. Moreover, because of the thinner width of the front portion 1600, the front portion 1600 serves to guide the optical modules into and through the module socket regions 420, 430. Furthermore, because of the wider width of the intermediate portion 1610, the intermediate portion 1610 enables the use of the airflow passageways 480, 482, 484, 486 and allows for a portion of the riding heatsinks to have an increased width (i.e., an increased heat dissipating surface area). The perforations 500, 510 disposed on the faces 1612, 1614, 1616, 1618 of the intermediate portion 1610 allow for additional cooling air to flow into the airflow passageways 480, 482, 484, 486.

Figure 17A:
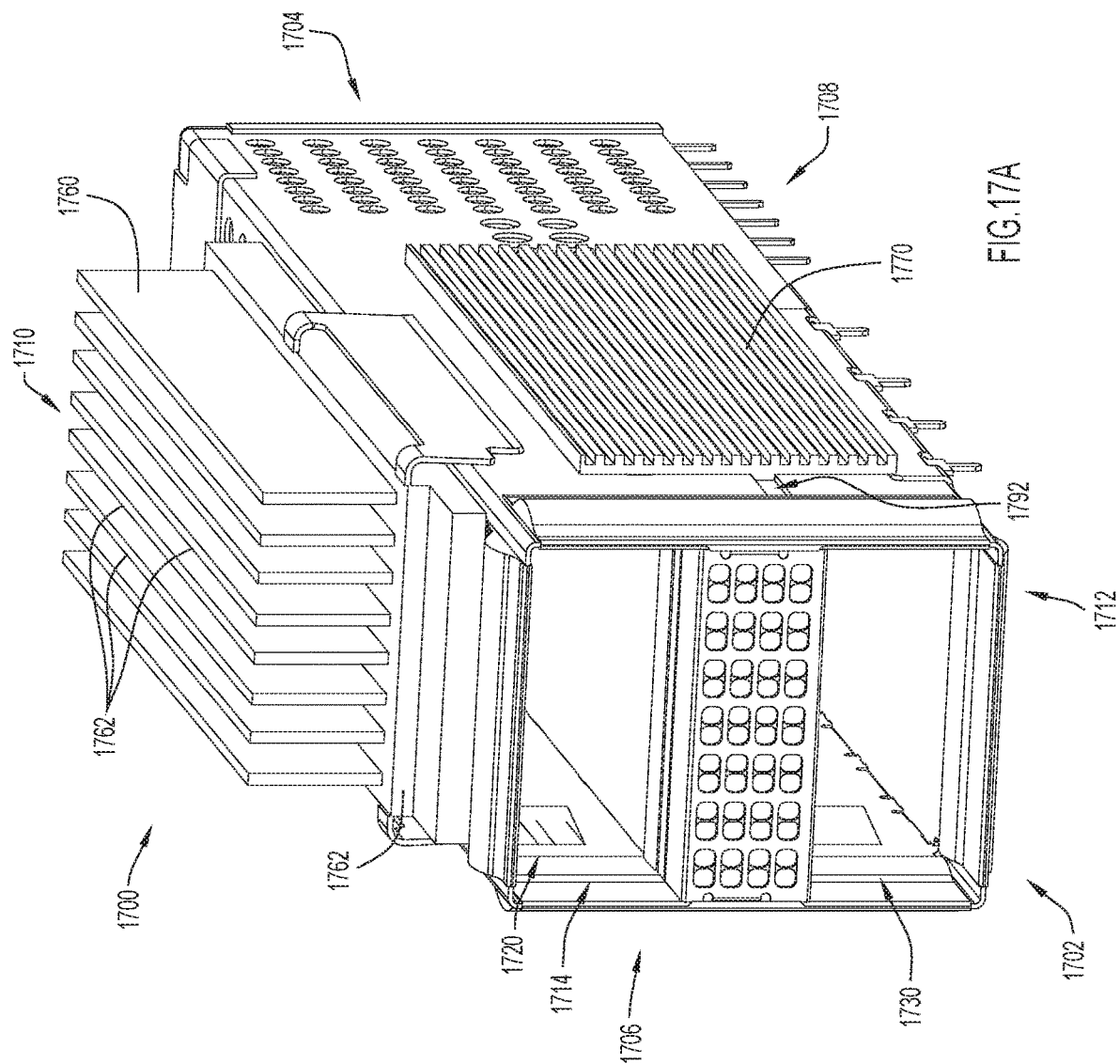
FIG. 17A illustrates a perspective front view of an optical module cage in a 2×1 stacked configuration with riding heatsinks, where the lower riding heatsink extends through the sidewalls of the optical module cage, in accordance with another example embodiment.
Figure 17B:
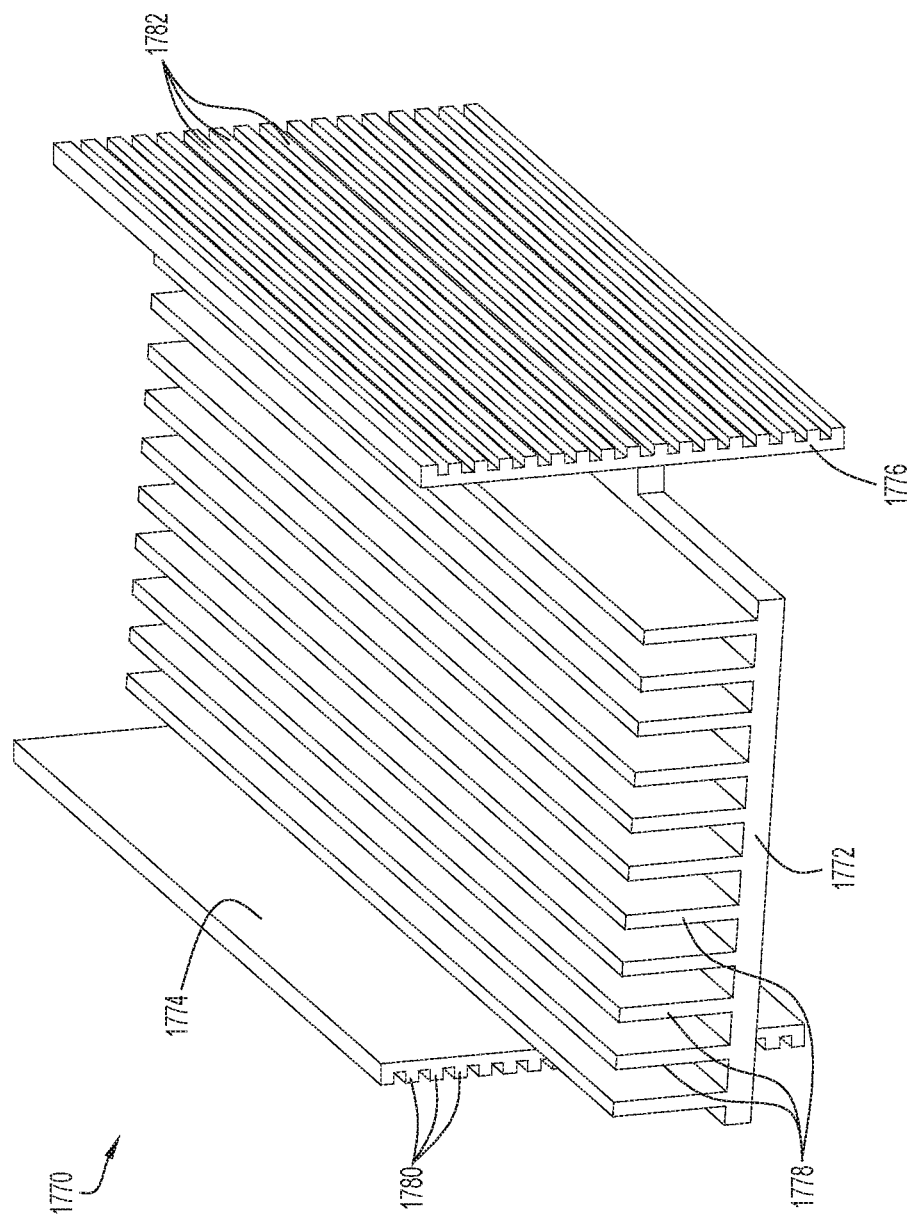
FIG. 17B illustrates an isolated perspective view of the lower riding heatsink illustrated in FIG. 17A, in accordance with an example embodiment.

Another example embodiment of an improved optical module cage capable of adequately cooling optical modules that handle increased data rates and output large amounts of heat (i.e., QSFP-DD optical modules) is illustrated in FIGS. 17A-17C, and shown generally at reference numeral 1700. Like the conventional optical module cage 100 illustrated in FIGS. 1A-1C, and the previously disclosed improved optical module cage 400 illustrated in FIGS. 4A-4D, the optical module cage 1700 illustrated in FIG. 17A-17C is in a 2×1 stacked configuration, and includes a front side 1702, a rear side 1704, a first side 1706, a second side 1708, a top side 1710, and a bottom side 1712. The sides 1702, 1704, 1706, 1708, 1710, 1712 of the cage 1700 collectively define an interior cavity 1714 of the cage 1700. Disposed within the interior cavity 1714 is a first module socket region 1720 and a second module socket region 1730, where the first and second module socket regions 1720, 1730 are open at the front side 1702 of the cage 1700, and extend along the first and second sides 1706, 1708 to a host-board connector (not shown) disposed within the interior cavity 1714 of the cage 1700. The first and second module socket regions 1720, 1730 may be configured to receive pluggable optical modules such as, but not limited to, QSFP-DD optical modules. The host-board connector may be, in some embodiments, a QSFP-DD host-board connector for connecting/interfacing QSFP-DD optical modules with electronic components, including, but not limited to, a PCB 1750 (shown in FIG. 17C) upon which the cage 1700 is disposed. Optical modules may be inserted through the front side 1702 of the cage 1700 such that the optical modules are disposed in one of the two module socket regions 1720, 1730 and connected to the host-board connector.

Continuing with FIGS. 17A-17C, the optical module cage 1700 may further include multiple riding heatsinks 1760, 1770. As illustrated, the upper riding heatsink 1760 is disposed on the top side 1710 of the cage 1700, and may be capable of at least partial abutment with an optical module disposed within, or plugged into, the first module socket region 1720. The lower riding heatsink 1770 may be disposed between the first module socket region 1720 and the second module socket region 1730, and may be capable of at least partial abutment with an optical module disposed within, or plugged into, the second module socket region 1730. As best illustrated in FIGS. 17A and 17C, the upper riding heatsink 1760 may have a base 1762 and a series of fins 1764 that extend vertically from the base 1762.

As best illustrated in FIGS. 17B and 17C, the lower riding heatsink 1770 may have a horizontal base 1772, a first vertical base 1774, and a second vertical base 1776. The first vertical base 1774 may be coupled to a first end or first side of the horizontal base 1772, while the second vertical base 1776 may be coupled to a second end or second side of the horizontal base 1772 such that the second vertical base 1776 is disposed on an opposing side of the horizontal base 1772 from that of the first vertical base 1774. The first and second vertical bases 1774, 1776 may be oriented parallel one another, and my extend both upwardly and downwardly from the horizontal base 1772. Thus, as illustrated in FIGS. 17B and 17C, the lower riding heatsink 1770 has a substantially H-shaped cross-section. Moreover, a first series of fins 1778 may be disposed on the horizontal base 1772 such that the first series of fins 1778 extend vertically from the horizontal base 1772. A second series of fins 1780 may be disposed on the first vertical base 1774 such that the second series of fins 1780 extend horizontally from the first vertical base 1774 in a direction that is away from the second vertical base 1776. A third series of fins 1782 may be disposed on the second vertical base 1776 such that the third series of fins 1782 extend horizontally from the second vertical base 1776 in a direction that is away from the first vertical base 1774.

As best illustrated in FIGS. 17A and 17C, the first side 1706 of the cage 1700 may have a first slot or channel 1790, while the second side 1708 of the cage 1700 may have a second slot or channel 1792. Moreover, the optical module cage 1700 may have a width W1, which is the dimensional spacing between the first and second sidewalls of the of the first and second sides 1706, 1708 of the cage 1700. This width W1 of the optical module cage 1700 may be substantially equivalent to the width W1 of the conventional optical module cage 100 illustrated in FIGS. 1A and 1B. However, the lower riding heatsink 1770 may have a width W4 that is wider than the width W1 such that portions of the lower riding heatsink 1770 are disposed outside of the interior cavity 1714 of the cage 1700. As best illustrated in the schematic front view of FIG. 17C, the horizontal base 1772 extends through the slots 1790, 1792 in the sides 1706, 1708, respectively, of the cage 1700, while the vertical bases 1774, 1776 and their associated fins 1780, 1782, respectively, are disposed outside of the interior cavity 1714 of the cage 1700.

The lower riding heatsink 1770 illustrated in FIGS. 17A-17C has an increased surface area and may be subjected to cooling air that flows both through the interior cavity 1714 of the cage 1700 (i.e., that flows over the horizontal base 1772 and its associated fins 1778) and around the cage 1700 (i.e., that flows over the vertical bases 1774, 1776 and their associated fins 1780, 1782). With the lower riding heatsink 1770 having a larger surface area and being subjected to multiple cooling air flows, the lower riding heatsink 1770 may be capable of dissipating more heat from an optical module plugged into the second module socket region 1720 than that of the lower riding heatsink 170 of the conventional cage 100.

Turning to FIG. 18, and with continued reference to FIGS. 17A-17C, illustrated is an embodiment of the optical module cage 1700, where the riding heatsinks 1760, 1770 are modified to accommodate an angled faceplate (not shown). As illustrated in FIG. 18, a portion of the upper riding heatsink 1760 that is disposed proximate to the front side 1702 of the cage 1700 includes an angled section 1800. In addition, the top end of a portion of the second vertical base 1776 of the lower riding heatsink 1770 that is disposed proximate to the front side 1702 and top side 1710 of the cage 1700 may also include an angled section 1810. While not illustrated, the first vertical base 1774 disposed on the first side 1706 of the cage 1700 may be substantially similar to the second vertical base 1776 such that the first vertical base 1774 also includes an angled section that is disposed proximate to the front side 1702 and top side 1710 of the cage 1700.

Turning to FIGS. 19A-19D, and with continued reference to FIGS. 17A-17C, illustrated various embodiments of the riding heatsinks 1760, 1770 of the cage 1700 that achieve similar cooling effects for optical modules disposed within the module socket regions 1720, 1730. As illustrated in FIG. 19A, the first and second vertical bases 1774, 1776 of the lower riding heatsink 1770 only extend downwardly, or descend, from the ends of the horizontal base 1772 of the lower riding heatsink 1770. Thus, the embodiment of the lower riding heatsink 1770 illustrated in FIG. 19A has a substantially inverted U-shape. As illustrated in FIG. 19B, the first and second vertical bases 1774, 1776 of the lower riding heatsink 1770 only extend downwardly or descend from the ends of the horizontal base 1772 of the lower riding heatsink 1770 like that illustrated in FIG. 19A. However, the upper riding heatsink 1760 may also include first and second vertical bases 1900, 1910 that extend downwardly from the ends of the base 1762 of the upper riding heatsink 1760. Furthermore, each vertical base 1900, 1910 of the upper riding heatsink 1760 may contain a set of horizontal fins 1902, 1912, respectively, like that of the lower riding heatsink 1770. Thus, the embodiment of the riding heatsinks 1760, 1770 illustrated in FIG. 19B may have a substantially inverted U-shape.

As illustrated in FIG. 19C, the first and second vertical bases 1774, 1776 of the lower riding heatsink 1770 only extend upwardly or ascend from the ends of the horizontal base 1772 of the lower riding heatsink 1770. Thus, the embodiment of the lower riding heatsink 1770 illustrated in FIG. 19C has a substantially U-shape. In addition, as illustrated in FIG. 19D, the first and second vertical bases 1774, 1776 of the lower riding heatsink 1770 extend both upwardly and downwardly from the ends of the horizontal base 1772 of the lower riding heatsink 1770, but the upwardly extending portions of the vertical bases 1774, 1776 are also coupled to the base 1762 of the upper riding heatsink 1760. Thus, as illustrated in FIG. 19D, the upper riding heatsink 1760 and the lower riding heatsink 1770 may be uniformly formed.

The embodiments presented herein provide optical module cage designs with optimized airflow thermal cooling capability for use with, for example, existing standard optical modules. The embodiments described herein include designs for cages and heatsinks that do not require end-user modification. Because some network devices have increased the horizontal, width, or X dimension, more space has been provided on the network devices. By optimizing optical module cage and associated heatsink design as described herein, the wider spacing between adjacent cages can be leveraged to improve cooling of the optical modules plugged into the cages. As previously explained, the creation of airflow passageways extending through the interior of the cage enables cooling air to directly contact the sides of an optical module plugged into the cage, while eliminating a thermal interface with the sidewalls of the cage (i.e., instead of a module-to-case-to-air interface to cool the sides of the optical modules, the description and embodiments provided herein provide a module-to-air interface for cooling the optical modules). The airflow passageways also enable airflow to more easily pass around and behind the host-board connector, which allows for an improved flowrate of air through the optical module cage, especially with respect to the second module socket region (i.e., the lower module socket regions of a stacked cage).

It is to be understood that the optical module form factors described herein are only examples and that the cages described herein may be used with other standard pluggable form factor modules or other existing or future pluggable optical module designs. It is to be further understood that while the example embodiments described herein illustrated a 2×1 stacked configuration, the example embodiments may be utilized with any stacked or ganged cage configuration, and are not limited to only 2×1 stacked configurations.

Furthermore, wider and larger heatsinks allow for an increased surface area and surface fin area, which results in better thermal cooling and heat dissipation of the modules. It is to be understood that various combinations of fin configurations and connector configurations may be used in conjunction in an optical module cage of the various embodiments. It is also to be understood that an optical module cage for use with multiple optical modules may be configured for use with the same or different fin configurations and/or connector configurations for the optical modules. For example, a heatsink(s) of a top optical module for an optical module cage may have the same or different fin configuration as a heatsink(s) of a bottom optical module for the optical module cage. As another example, a connector for a top optical module for an optical module cage may have the same or different connector configuration as a bottom optical module for the optical module cage.

In one embodiment, an optical module receptacle assembly includes a receptacle cage and at least one socket region disposed within the receptacle cage. The receptacle cage may have at least a front face, a first sidewall, a second sidewall and a rear face that collectively define an interior cavity. Furthermore, the receptacle cage may have a first width that spans between the first sidewall and the second sidewall. The at least one socket region may be disposed within the interior cavity of the receptacle cage, and may be configured to receive an optical module that is inserted into the receptacle cage through the front face of the receptacle cage. The at least one socket region, moreover, may have a second width that is smaller than the first width. Thus, a first airflow passageway and a second airflow passageway may be disposed within the receptacle cage, where the first airflow passageway may be defined by the first sidewall and the module when the module is disposed within the at least one socket region, and the second airflow passageway may defined by the second sidewall and the module when the module is disposed within the at least one socket region.

This embodiment of the optical module receptacle assembly may further include a connector that is disposed within the interior cavity of the receptacle cage proximate to the at least one socket region. The connected may be disposed within the interior cavity such that the connector may at least partially receive a module that is disposed within the at least one socket region. The connector may have a third width that is equal to the second width of the at least one socket region. The connector may be spaced from the rear face of the receptacle cage. Furthermore, a plurality of perforations may be disposed across the rear face of the receptacle cage.

This embodiment of the optical module receptacle assembly may further include a heatsink disposed within the receptacle cage proximate to the at least one socket region. The heatsink may be disposed within the interior cavity such that the heatsink is in abutment with a module that is disposed within the at least one socket region. The heatsink may have a fourth width that is larger than the second width and the third width. In addition, the heatsink may include a base and a plurality of fins that extend from the base. The plurality of fins may be shaped to direct airflow traveling through the heatsink into the first airflow passageway and the second airflow passageway, and may be shaped to direct the airflow around the connector.

The receptacle cage of this embodiment of the optical module receptacle assembly may be a stacked cage, the at least one socket region may be a first socket region, and the module may be a first module where the optical module receptacle assembly further includes a second socket region that may be disposed within the interior cavity of the receptacle cage and may be disposed above the first socket region. The second socket region may be configured to receive a second module inserted into the front face of the receptacle cage. Furthermore, the second socket region may have a third width that is equal to the second width of the first socket region. The first airflow passageway may be further defined by the first sidewall of the receptacle cage, the first module when disposed within the first socket region, and the second module when disposed within the second socket region. Additionally, the second airflow passageway may be further defined by the second sidewall of the receptacle cage, the first module when disposed within the first socket region, and the second module when disposed within the second socket region. A central airflow passageway may be disposed between the second socket region and the first socket region. This embodiment of the optical module receptacle assembly may further include a first heatsink and a second heatsink. The first heatsink may be disposed within the interior cavity of the receptacle cage proximate to the first socket region such that the first heatsink is in abutment with the first module when the first module is disposed within the first socket region. The second heatsink may be disposed atop the receptacle cage proximate to the second socket region.

In another embodiment, an optical module receptacle assembly may include a receptacle cage, at least one socket region disposed within the receptacle cage, a first airflow passage disposed within the receptacle cage, and a second airflow passage disposed within the receptacle cage. The receptacle cage may include at least a front face, a first sidewall, a second sidewall, and a rear face that collectively define an interior cavity. The at least one socket region may be disposed within the interior cavity of the receptacle cage, and may be configured to receive an optical module that is inserted into the receptacle cage through the front face of the receptacle cage. The first airflow passage may be disposed within the interior cavity of the receptacle cage such that the first airflow passage may be disposed between the first sidewall of the receptacle cage and the at least one socket region. Furthermore, the first airflow passage may span from the front face of the receptacle cage toward the rear face of the receptacle cage. The second airflow passage may be disposed within the interior cavity of the receptacle cage such that the second airflow passage may be disposed between the second sidewall of the receptacle cage and the at least one socket region. The second airflow passage may also span from the front face of the receptacle cage toward the rear face of the receptacle cage.

This embodiment of the optical module receptacle assembly may further include a connector disposed within the interior cavity of the receptacle cage. The connector may be disposed proximate to the at least one socket region such that the connector at least partially receives the module when the module is disposed within the at least one socket region. The connector may be spaced from the rear face of the receptacle cage. In addition, the first airflow passage may be further disposed between the first sidewall and the connector, and the second airflow passage may be further disposed between the second sidewall and the connector. Furthermore, a plurality of perforations may be disposed across the rear face of the receptacle cage. The receptacle cage of this embodiment of the optical module receptacle assembly may have a length spanning from the front face to the rear face. The receptacle assembly may further include at least one perforation disposed on a first sidewall and at least one perforations disposed on the second sidewall. The at least one perforation disposed on the first sidewall may be located at a position that is rearward of the connector along the length of the receptacle cage. The at least one perforation disposed on the second sidewall may be located at a position that is rearward of the connector along the length of the receptacle cage.

This embodiment of the optical module receptacle assembly may further include a heatsink. The heatsink may be disposed within the receptacle cage proximate to the at least one socket region such that the heatsink is in abutment with the module when the module is disposed within the at least one socket region. The heatsink may include a base and a plurality of fins. The base may extend at least partially into the first airflow passage and at least partially into the second airflow passage. The plurality of fins may extend from the base.

In yet another embodiment, an optical module receptacle assembly may include a receptacle cage, at least one socket region, and a heatsink. The receptacle cage may have at least a front face, a first sidewall, a second sidewall, and a rear face that collectively define an interior cavity. Furthermore, the receptacle cage may have a first width that spans between the first sidewall and the second sidewall. The at least one socket region may be disposed within the interior cavity of the receptacle cage and may be configured to receive an optical module that is inserted into the receptacle cage through the front face of the receptacle cage. The at least one socket region may have a second width that is smaller than the first width. In addition, the heatsink may also be disposed within the interior cavity of the receptacle cage such that the heatsink may be disposed proximate to the at least one socket region. Thus, the heatsink may be disposed within the interior cavity of the receptacle cage such that the heatsink may be in abutment with an optical module that is disposed within the at least one socket region. Furthermore, the heatsink may have a third width that is larger than the second width of the at least one socket region.

The heatsink of this embodiment of the optical module receptacle assembly may further include a base and a plurality of fins. The plurality of fins may extend from the base. In addition, the plurality of fins may include a first set of fins that extend from the base in a first direction and second set of fins that extend from the base in a second direction that is opposite of the first direction.

The receptacle cage of this embodiment of the optical module receptacle assembly may be a stacked cage, the at least one socket region may be a first socket region, the heatsink may be a first heatsink, and the module may be a first module. This embodiment of the optical module receptacle assembly may further include a second socket region, a second heatsink, and a central airflow passageway. The second socket region may be disposed within the interior cavity of the receptacle cage above the first socket region. The second socket region may be configured to receive a second module inserted into the front face of the receptacle cage. The second socket region may have a fourth width that is equal to the second width of the first socket region. The second heatsink may be disposed atop the receptacle cage proximate to the second socket region. The second heatsink may have a fifth width that is larger than the second width and the fourth width. The central airflow passageway may be disposed between the first socket region and the second socket region.

The plurality of fins of the first heatsink may include a first set of fins that extend from the base in a first direction and a first distance from the base, a second set of fins that extend from the base in the first direction and a second distance from the base, and a third set of fins that extend from the base in a second direction and a third distance from the base. The third set of fins may be disposed between the first socket region and the first and second sidewalls of the receptacle cage. The second distance may be larger than the first distance such that the second set of fins are at least partially disposed between the second socket region and the first and second sidewalls of the receptacle cage.

The heatsink of this embodiment of the optical module receptacle assembly may be U-shaped such that portions of the heatsink are disposed along three sides of the at least one socket region.

In one embodiment, a receptacle assembly may include a receptacle cage and a heatsink. The receptacle cage may have a first sidewall and a second sidewall that may define an interior cavity. The receptacle cage may have a first width spanning between the first sidewall and the second sidewall. The heatsink may be at least partially disposed within the interior cavity of the receptacle cage. Moreover, the heatsink may have a second width that is greater than the first width of the receptacle cage.

The receptacle cage of this embodiment of the receptacle assembly may be a stacked cage further includes a front face and a rear face. The receptacle assembly may include a first socket region and a second socket region. The first socket region may be disposed within the interior cavity of the receptacle cage proximate to the front face of the receptacle cage. The second socket region may be disposed within the interior cavity of the receptacle cage proximate to the front face of the receptacle cage. The second socket region being disposed above the first socket region within the interior cavity of the receptacle cage. The heatsink may be disposed between the first socket region and the second socket region. The heatsink may include a horizontal portion, a first vertical portion, and a second vertical portion. The first vertical portion may be coupled to a first side of the horizontal portion, and the second vertical portion may be coupled to a second side of the horizontal portion. The heatsink may have an inverted U-shape such that the first vertical portion and the second vertical portion are disposed outside of the interior cavity of the receptacle cage. The first vertical portion and the second vertical portion may descend from the horizontal portion. Another embodiment of the heatsink may have an H-shape such that the first vertical portion and the second vertical portion are disposed outside of the interior cavity of the receptacle cage. The first vertical portion and the second vertical portion may extend upwardly and downwardly from the horizontal portion. Yet another embodiment of the heatsink may further include a first set of fins that extend vertically from the horizontal portion, a second set of fins that extend horizontally from the first vertical portion, a third set of fins that extend horizontally from the second vertical portion.

In an additional embodiment of the heatsink, the heatsink may include a first horizontal portion disposed between the first socket region and the second socket region, a second horizontal portion disposed above the second socket region and oriented parallel to the first horizontal portion, a first vertical portion coupled to a first side of the first horizontal portion and a first side of the second horizontal portion, and a second vertical portion coupled to a second side of the first horizontal portion and a second side of the second horizontal portion.

In another embodiment, a receptacle assembly may include a receptacle cage and a heatsink. The receptacle cage may have a plurality of sidewalls that define an interior cavity. The heatsink may have a first portion and a second portion. The first portion of the heatsink may be at least partially disposed within the interior cavity of the of the receptacle cavity, and may extend through at least one of the sidewalls of the plurality of sidewalls of the receptacle cage. The second portion of the heatsink may be disposed outside of the receptacle cage.

For this embodiment of the receptacle assembly, the first portion of the heatsink may be oriented horizontally, and the second portion may be oriented vertically. The second portion may be coupled to a first end of the first portion. The heatsink may further include a third portion that may be oriented vertically. The third portion of the heatsink may be coupled to a second end of the first portion. The third portion of the heatsink may also be disposed outside of the receptacle cage. The heatsink may further include a first plurality of fins, a second plurality of fins, and a third plurality of fins. The first plurality of fins may be disposed on the first portion of the heatsink. The second plurality of fins may be disposed on the second portion of the heatsink. The third plurality of fins may be disposed on the third portion of the heatsink. The first plurality of fins of the heatsink may extend from the first portion of the heatsink in a vertical direction. The second plurality of fins of the heatsink may extend from the second portion of the heatsink in a first horizontal direction. The third plurality of fins of the heatsink may extend from the third portion of the heatsink in a second horizontal direction. The second horizontal direction may be opposite the first horizontal direction.

In one embodiment of the heatsink, the heatsink may be U-shaped, where the second portion of the heatsink is parallel to the third portion. In another embodiment of the heatsink, the heatsink may be H-shaped, where the second portion is parallel to the third portion.

With this embodiment of the receptacle assembly, the first portion of the heatsink may be oriented horizontally and the second portion of the heatsink may be oriented vertically. The heatsink may further include a third portion that is oriented horizontally. The third portion of the heatsink may be coupled to the second portion. The third portion of the heatsink may be spaced from the first portion. The heatsink may also include a fourth portion that is oriented vertically. The fourth portion of the heatsink may be coupled to the first portion and the third portion. The fourth portion may be spaced from the second portion.

In yet another embodiment, a receptacle assembly may include a receptacle cage, at least one socket region, and a heatsink. The receptacle cage may have a front face, a first sidewall, a second sidewall, and a rear face that define an interior cavity. The at least one socket region may be disposed within the interior cavity of the receptacle cage proximate to the front face of the receptacle cage. Furthermore, the heatsink may have a first portion and a second portion. The first portion of the heatsink may be in abutment with the at least one socket region. The second portion of the heatsink may be disposed outside of the interior cavity.

The receptacle cage of this embodiment of the receptacle assembly may be a stacked cage, the at least one socket region may be a first socket region. The receptacle assembly may further include a second socket region disposed within the interior cavity of the receptacle cage. The second socket region may be disposed proximate to the front face of the receptacle cage. The second socket region may be disposed above the first socket region within the interior cavity of the receptacle cage. The first portion of the heatsink may be disposed between the first socket region and the second socket region. In one embodiment of the heatsink, the second portion of the heatsink may extend along downwardly from the first portion. In another embodiment of the heatsink, the second portion of the heatsink may extend upwardly and downwardly from the first portion.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A receptacle assembly comprising:
   a receptacle cage having at least a front face, a rear face opposite the front face, a first sidewall spanning from the front face to the rear face, and a second sidewall spanning from the front face to the rear face, the front face, the rear face, the first sidewall, and the second sidewall collectively defining an interior cavity, the receptacle cage having a first width spanning between an outer surface of the first sidewall and an outer surface of the second sidewall; and
   a heatsink at least partially disposed within the interior cavity of the receptacle cage and having a second width that is greater than the first width of the receptacle cage such that the heatsink extends at least partially through the first sidewall and at least partially through the second sidewall.

2. The receptacle assembly of claim 1, wherein the receptacle cage is a stacked cage, the receptacle assembly further comprising:
   a first socket region disposed within the interior cavity of the receptacle cage proximate to the front face of the receptacle cage; and
   a second socket region disposed within the interior cavity of the receptacle cage proximate to the front face of the receptacle cage, the second socket region being disposed above the first socket region within the interior cavity of the receptacle cage.

3. The receptacle assembly of claim 2, wherein the heatsink is disposed between the first socket region and the second socket region.

4. The receptacle assembly of claim 3, wherein the heatsink includes a horizontal portion, a first vertical portion coupled to a first side of the horizontal portion, and a second vertical portion coupled to a second side of the horizontal portion.

5. The receptacle assembly of claim 4, wherein the heatsink has an inverted U-shape such that the first vertical portion and the second vertical portion are disposed outside of the interior cavity of the receptacle cage, and descend from the horizontal portion.

6. The receptacle assembly of claim 4, wherein the heatsink has an H-shape such that the first vertical portion and the second vertical portion are disposed outside of the interior cavity of the receptacle cage and extend upwardly and downwardly from the horizontal portion.

7. The receptacle assembly of claim 4, wherein the heatsink further comprises:
   a first set of fins that extend vertically from the horizontal portion;
   a second set of fins that extend horizontally from the first vertical portion; and
   a third set of fins that extend horizontally from the second vertical portion.

8. The receptacle assembly of claim 2, wherein the heatsink includes a first horizontal portion disposed between the first socket region and the second socket region, a second horizontal portion disposed above the second socket region and oriented parallel to the first horizontal portion, a first vertical portion coupled to a first side of the first horizontal portion and a first side of the second horizontal portion, and a second vertical portion coupled to a second side of the first horizontal portion and a second side of the second horizontal portion.

9. A receptacle assembly comprising:
   a receptacle cage having a front face, a rear face opposite the front face, and a plurality of sidewalls spanning from the front face to the rear face, the front face, the rear face, and the plurality of sidewalls collectively defining an interior cavity; and
   a heatsink having a first portion and a second portion coupled to the first portion, the first portion being at least partially disposed within the interior cavity of the receptacle cage and extending through at least one of the plurality of sidewalls of the receptacle cage, the second portion being disposed outside of the receptacle cage.

10. The receptacle assembly of claim 9, wherein the first portion is oriented horizontally, and the second portion is oriented vertically, the second portion being coupled to a first end of the first portion.

11. The receptacle assembly of claim 10, wherein the heatsink further comprises:
    a third portion that is oriented vertically, is coupled to a second end of the first portion, and is disposed outside of the receptacle cage.

12. The receptacle assembly of claim 11, wherein the heatsink further includes a first plurality of fins disposed on the first portion, a second plurality of fins disposed on the second portion, and a third plurality of fins disposed on the third portion, the first plurality of fins extend from the first portion in a vertical direction, the second plurality of fins extend from the second portion in a first horizontal direction, and the third plurality of fins extend from the third portion in a second horizontal direction, where the second horizontal direction is opposite the first horizontal direction.

13. The receptacle assembly of claim 11, wherein the heatsink is U-shaped, where the second portion is parallel to the third portion.

14. The receptacle assembly of claim 11, wherein the heatsink is H-shaped, where the second portion is parallel to the third portion.

15. The receptacle assembly of claim 9, wherein the first portion is oriented horizontally and the second portion is oriented vertically, the heatsink further comprising:
    a third portion that is oriented horizontally, is coupled to the second portion, and is spaced from the first portion; and
    a fourth portion that is oriented vertically, is coupled to the first portion and the third portion, and is spaced from the second portion.

16. A receptacle assembly comprising:
    a receptacle cage having a front face, a first sidewall, a second sidewall, and a rear face that define an interior cavity;
    at least one socket region disposed within the interior cavity of the receptacle cage proximate to the front face of the receptacle cage; and a heatsink having a first portion that is in abutment with the at least one socket region, and a second portion that is coupled to the first portion and disposed outside of the interior cavity proximate to either the first sidewall or the second sidewall.

17. The receptacle assembly of claim 16, wherein the receptacle cage is a stacked cage, the at least one socket region is a first socket region, and the receptacle assembly further comprising:

a second socket region disposed within the interior cavity of the receptacle cage proximate to the front face of the receptacle cage, the second socket region being disposed above the first socket region within the interior cavity of the receptacle cage.

18. The receptacle assembly of claim 17, wherein the first portion of the heatsink is disposed between the first socket region and the second socket region.

19. The receptacle assembly of claim 17, wherein the second portion of the heatsink extends downwardly from the first portion along either the first sidewall or the second sidewall.

20. The receptacle assembly of claim 17, wherein the second portion of the heatsink extends upwardly and downwardly from the first portion along either the first sidewall or the second sidewall.

* * * * *